(12) United States Patent
Cho et al.

(10) Patent No.: US 10,971,662 B2
(45) Date of Patent: Apr. 6, 2021

(54) LIGHT EMITTING DIODE PACKAGE AND METHOD OF MANUFACTURING THE SAME

(71) Applicant: Samsung Electronics Co., Ltd., Suwon-si (KR)

(72) Inventors: Hyuk-jin Cho, Seoul (KR); Dong-hoon Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 870 days.

(21) Appl. No.: 15/145,972

(22) Filed: May 4, 2016

(65) Prior Publication Data

US 2016/0372642 A1   Dec. 22, 2016

(30) Foreign Application Priority Data

Jun. 19, 2015 (KR) .................. 10-2015-0087586

(51) Int. Cl.
| | |
|---|---|
| *H01L 33/50* | (2010.01) |
| *H01L 33/54* | (2010.01) |
| *H01L 33/48* | (2010.01) |
| *H01L 33/60* | (2010.01) |

(52) U.S. Cl.
CPC ............ *H01L 33/505* (2013.01); *H01L 33/54* (2013.01); *H01L 33/486* (2013.01); *H01L 33/60* (2013.01); *H01L 2224/96* (2013.01)

(58) Field of Classification Search
CPC ......... H01L 33/52; H01L 33/54; H01L 33/60; H01L 33/58; H01L 33/50; H01L 33/505
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

FOREIGN PATENT DOCUMENTS

| | | |
|---|---|---|
| CN | 1806346 A | 7/2006 |
| CN | 101867003 A | 10/2010 |

(Continued)

OTHER PUBLICATIONS

Chinese Office Action for corresponding Application No. 201610445704.9 dated Jan. 4, 2019.

(Continued)

*Primary Examiner* — Stephen W Smoot
*Assistant Examiner* — Sun Mi Kim King
(74) *Attorney, Agent, or Firm* — Harness, Dickey & Pierce, P.L.C.

(57) ABSTRACT

A light-emitting diode (LED) package includes a light-emitting structure, a transmissive material layer on the light-emitting structure, and a support structure covering at least a portion of a side surface of the transmissive material layer, a side surface of the light-emitting structure, and at least a portion of a bottom surface of the light-emitting structure.

9 Claims, 47 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,393,489 B2 | 7/2008 | Cho |
| 7,501,656 B2 | 3/2009 | Han et al. |
| 7,709,857 B2 | 5/2010 | Kim et al. |
| 7,759,140 B2 | 7/2010 | Lee et al. |
| 7,759,145 B2 | 7/2010 | Fujii |
| 7,781,727 B2 | 8/2010 | Sherrer et al. |
| 7,790,482 B2 | 9/2010 | Han et al. |
| 7,940,350 B2 | 5/2011 | Jeong |
| 7,947,530 B2 | 5/2011 | Kim et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,330,182 B2 | 12/2012 | Suenaga |
| 8,367,475 B2 | 2/2013 | Law et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,836,208 B2 * | 9/2014 | Kazuya ............... H01L 33/56 313/498 |
| 2011/0201156 A1 | 8/2011 | Kim et al. |
| 2012/0032200 A1 * | 2/2012 | Kwon ................ H01L 33/50 257/88 |
| 2013/0228817 A1 | 9/2013 | Li et al. |
| 2014/0138725 A1 * | 5/2014 | Oyamada ............ H01L 33/505 257/98 |
| 2014/0203416 A1 | 7/2014 | Huang |
| 2014/0374786 A1 | 12/2014 | Bierhuizen |
| 2015/0028471 A1 | 1/2015 | Lin et al. |
| 2015/0311405 A1 * | 10/2015 | Oyamada ............ H01L 33/50 257/98 |
| 2015/0316215 A1 * | 11/2015 | Togawa ........... H01L 25/0753 362/231 |

FOREIGN PATENT DOCUMENTS

| | | |
|---|---|---|
| CN | 103682036 A | 3/2014 |
| CN | 203774363 U | 8/2014 |
| CN | 104916765 A | 9/2015 |
| JP | 2010157638 A | 7/2010 |
| KR | 2003-0042929 A | 6/2003 |
| KR | 10-0555495 B1 | 3/2006 |
| KR | 2007-0120376 A | 12/2007 |
| KR | 2010-0071485 A | 6/2010 |
| KR | 2011-0126096 A | 11/2011 |
| KR | 2012-0109410 A | 10/2012 |
| KR | 2014-0123720 A | 10/2014 |

OTHER PUBLICATIONS

Chinese Office Action for corresponding Application No. 201610445704.9, dated Dec. 4, 2019.

* cited by examiner

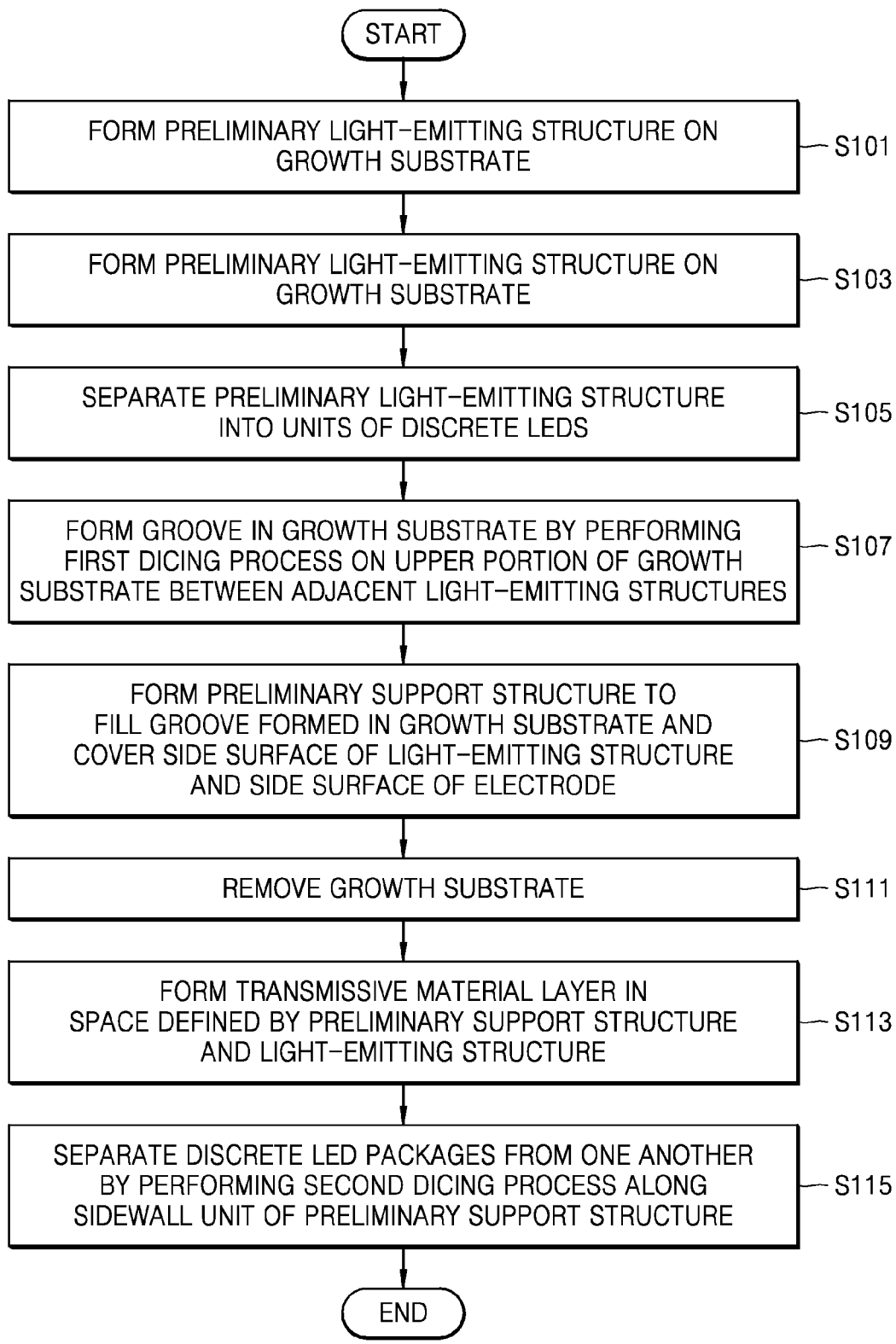

FIG. 16

| PURPOSE | PHOSPHOR |
|---|---|
| LED TV BLU | $\beta$-SiAlON:Eu$^{2+}$<br>(Ca,Sr)AlSiN$_3$:Eu$^{2+}$<br>La$_3$Si$_6$O$_{11}$:Ce$^{3+}$<br>K$_2$SiF$_6$: Mn$^{4+}$<br>K$_2$TiF$_6$: Mn$^{4+}$<br>K$_3$SiF$_7$: Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$)  (1) |
| LIGHTING APPARATUS | Lu$_3$Al$_5$O$_{12}$:Ce$^{3+}$<br>Ca-$\alpha$-SiAlON:Eu$^{2+}$<br>La$_3$Si$_6$N$_{11}$:Ce$^{3+}$<br>(Ca,Sr)AlSiN$_3$:Eu$^{2+}$<br>Y$_3$Al$_5$O$_{12}$:Ce$^{3+}$<br>K$_2$SiF$_6$: Mn$^{4+}$<br>K$_2$TiF$_6$: Mn$^{4+}$<br>K$_3$SiF$_7$: Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$)  (1) |
| SIDE VIEW (Mobile, Note PC) | Lu$_3$Al$_5$O$_{12}$:Ce$^{3+}$<br>Ca-$\alpha$-SiAlON:Eu$^{2+}$<br>La$_3$Si$_6$N$_{11}$:Ce$^{3+}$<br>(Ca,Sr)AlSiN$_3$:Eu$^{2+}$<br>Y$_3$Al$_5$O$_{12}$:Ce$^{3+}$<br>(Sr,Ba,Ca,Mg)$_2$SiO$_4$:Eu$^{2+}$<br>K$_2$SiF$_6$: Mn$^{4+}$<br>K$_2$TiF$_6$: Mn$^{4+}$<br>K$_3$SiF$_7$: Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$)  (1) |
| ELECTRIC EQUIPMENT (Head Lamp etc.) | Lu$_3$Al$_5$O$_{12}$:Ce$^{3+}$<br>Ca-$\alpha$-SiAlON:Eu$^{2+}$<br>La$_3$Si$_6$N$_{11}$:Ce$^{3+}$<br>(Ca,Sr)AlSiN$_3$:Eu$^{2+}$<br>Y$_3$Al$_5$O$_{12}$:Ce$^{3+}$<br>K$_2$SiF$_6$: Mn$^{4+}$<br>K$_2$TiF$_6$: Mn$^{4+}$<br>K$_3$SiF$_7$: Mn$^{4+}$<br>NaYF$_4$:Mn$^{4+}$<br>NaGdF$_4$:Mn$^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$)  (1) |

LIGHT EMITTING DIODE PACKAGE AND METHOD OF MANUFACTURING THE SAME

CROSS-REFERENCE TO RELATED APPLICATION

This application claims the benefit of Korean Patent Application No. 10-2015-0087586, filed on Jun. 19, 2015, in the Korean Intellectual Property Office, the disclosure of which is incorporated herein in its entirety by reference.

BACKGROUND

1. Field

Some example embodiments of the inventive concepts relate to a light-emitting diode (LED) package and/or a method of manufacturing the same, for example, to a chip-scale LED package and/or a method of manufacturing the same.

2. Description of the Related Art

In general, an LED package includes a chip mounted in a package including a lead frame substrate. Since the LED package needs not only an additional substrate but to also have a relatively large package size, the cost of materials may increase. Also, the total manufacturing cost may increase due to an additional packaging process.

A chip-scale package (CSP), which is a package manufactured on a wafer level, may be effective in reducing the manufacturing cost. However, in the CSP, as a street width, i.e., a space between discrete dies, decreases, a reflection region may be reduced, thus causing a reduction in luminance.

SUMMARY

Some example embodiments of the inventive concepts provide a downscaled chip-scale light-emitting diode (LED) package, which may inhibit optical loss and output uniform luminance, and/or a method of manufacturing the same.

According to an example embodiment of the inventive concepts, an LED package includes a light-emitting structure, a transmissive material layer on the light-emitting structure, and a support structure covering at least a portion of a side surface of the transmissive material layer, a side surface of the light-emitting structure, and at least a portion of a bottom surface of the light-emitting structure.

The LED package may further include an electrode connected to the bottom surface of the light-emitting structure. The support structure may define the electrode and cover the bottom surface of the light-emitting structure.

The support structure may have a cup shape, and may include a bottom unit at a lower level than the bottom surface of the light-emitting structure, and a sidewall unit at a higher level than the bottom surface of the light-emitting structure and covering at least a portion of the side surface of the transmissive material layer and the side surface of the light-emitting structure.

The sidewall unit may be divided into a first sidewall and a second sidewall, the first sidewall may contact a side surface of the transmissive material layer, and the second sidewall may contact a side surface of the light-emitting structure. A first thickness of the first sidewall may be less than or equal to a second thickness of the second sidewall.

The first sidewall may be divided into a first section including a top surface of the first sidewall and a second section that contacts a top surface of the second sidewall. A third thickness of the first section may be less than a fourth thickness of the second section.

An interface between the transmissive material layer and the sidewall unit may have a sloped shape.

An interface between the transmissive material layer and the sidewall unit may have a stepped shape.

A top surface of the transmissive material layer may have one of a convex shape, a flat shape, and a concave shape.

The support structure may include a first material from a bottom surface of the support structure to a first level, and a second material from the first level to a top surface of the support structure, the second material different from the first material.

The first level may be in a range from a level of the bottom surface of the light-emitting structure to a level of a bottom surface of the transmissive material layer. The light reflection efficiency of the first material may be greater than that of the second material.

A difference between a width of the support structure and a width of the light-emitting structure may be less than half the width of the light-emitting structure.

The support structure may be one body including a same material.

The transmissive material layer may include at least one of a wavelength conversion layer and a lens layer.

The transmissive material layer may have a stack structure including a plurality of wavelength conversion layers.

According to another example embodiment of the inventive concepts, an LED package includes a light-emitting structure, a transmissive material layer on the light-emitting structure, an electrode connected to a bottom surface of the light-emitting structure, and a support structure having a width equal to a width of the LED package, the support structure including a bottom unit defining the electrode at a lower level than the bottom surface of the light-emitting structure and covering the bottom surface of the light-emitting structure, and a sidewall unit covering at least a portion of a side surface of the transmissive material layer and a side surface of the light-emitting structure at a higher level than the bottom surface of the light-emitting structure.

According to yet another example embodiment of the inventive concepts, an LED package includes a support having a cup shape defining a cavity, a semiconductor layer in the cavity, and a transmissive material layer on the semiconductor layer. The support includes a bottom support including a first material, a first sidewall support including the first material, and a second sidewall support including a second material having a light efficiency different from the first material.

The LED package may further include an electrode connected to the bottom surface of the semiconductor layer. At least a portion of a bottom surface of the semiconductor layer may be covered by the bottom support, a side surface of the semiconductor layer may be covered by the first sidewall support, and at least a portion of a side surface of the transmissive material layer may be covered by the second sidewall support.

A thickness of the first sidewall support may be greater than or equal to a thickness of the second sidewall support.

An interface between the transmissive material layer and the second sidewall support may have one of a sloped shape and a stepped shape, and a top surface of the transmissive material layer may have one of a convex shape, a flat shape, and a concave shape.

The support may have a width equal to a width of the LED package.

BRIEF DESCRIPTION OF THE DRAWINGS

Example embodiments of the inventive concepts will be more clearly understood from the following detailed description taken in conjunction with the accompanying drawings in which:

FIG. 9 is a flowchart of a method of manufacturing an LED package, according to example embodiments;

FIG. 16 shows types of phosphors according to applications included a white LED package using a blue LED chip (about 440 nm to about 460 nm);

DETAILED DESCRIPTION

Figure 1A:
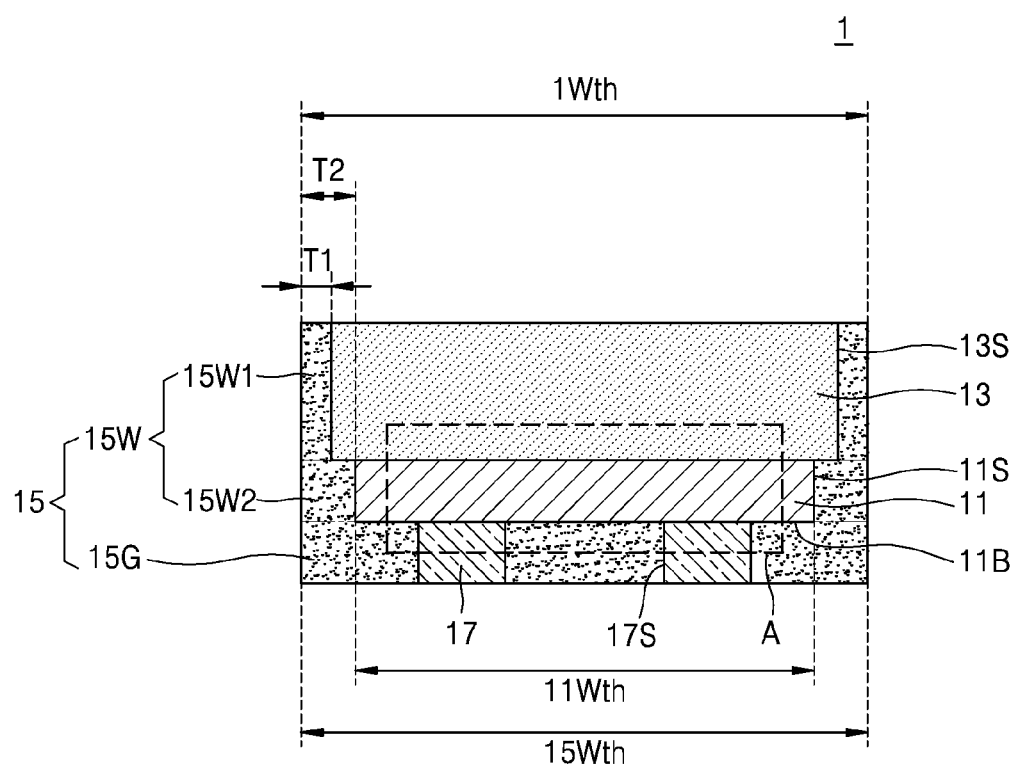
FIGS. 1A-1B, 2-7 and 8A are cross-sectional views of light-emitting diode (LED) packages according to example embodiments.

The inventive concepts now will be described more fully hereinafter with reference to the accompanying drawings, in which elements of the inventive concepts are shown.

The inventive concepts may, however, be embodied in many different forms and should not be construed as limited to the example embodiments set forth herein. Rather, these embodiments are provided so that this disclosure will be thorough and complete, and will fully convey the scope of the inventive concepts to one of ordinary skill in the art.

It will be understood that when an element is referred to as being "on" another element, it can be directly on the other element, or intervening elements may also be present therebetween. Likewise, it will be understood that when an element is referred to as being "connected" to another element, it may be "directly connected" to the other element or intervening elements may be present therebetween. Structures or sizes of elements in the drawings are exaggerated for convenience of description and clarity and parts in the drawings unrelated to the detailed description are omitted. Like reference numerals refer to like elements throughout. The terminology used herein is for the purpose of describing example embodiments only and is not intended to be limiting of example embodiments. As used herein, the term "and/or" includes any and all combinations of one or more of the associated listed items. Expressions such as "at least one of," when preceding a list of elements, modify the entire list of elements and do not modify the individual elements of the list.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

As used herein, the term "and/or" includes any and all combinations of one or more of the associated listed items. Expressions such as "at least one of," when preceding a list of elements, modify the entire list of elements and do not modify the individual elements of the list.

The inventive concepts may be embodied in many different forms and should not be construed as limited to the example embodiments set forth herein. For example, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Like reference numerals in the drawings denote like elements, and thus descriptions thereof will be omitted. Since various elements and regions are schematically illustrated in the drawings, the inventive concepts are not limited by relative sizes or intervals.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

In the following description, expressions "top surface" and "bottom surface" refer to an upper portion and a lower portion, respectively, in the drawings.

The inventive concepts will be described more fully hereinafter with reference to the accompanying drawings, in which example embodiments of the inventive concepts are shown.

In the drawings, essential parts of semiconductor devices according to example embodiments are shown.

Figure 1B:
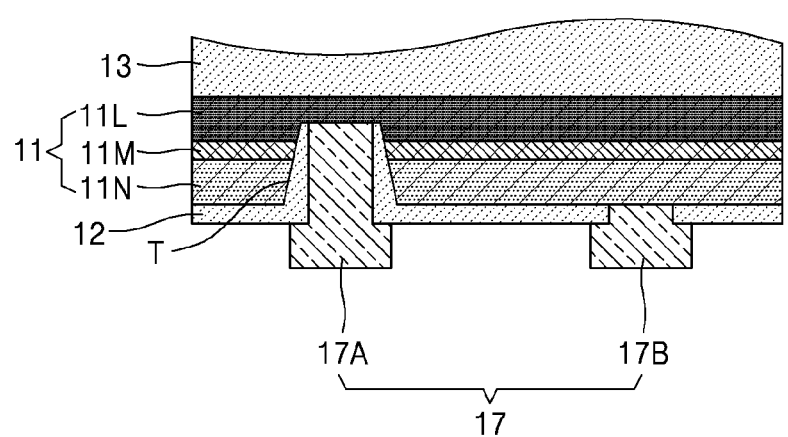
Figure 1C:
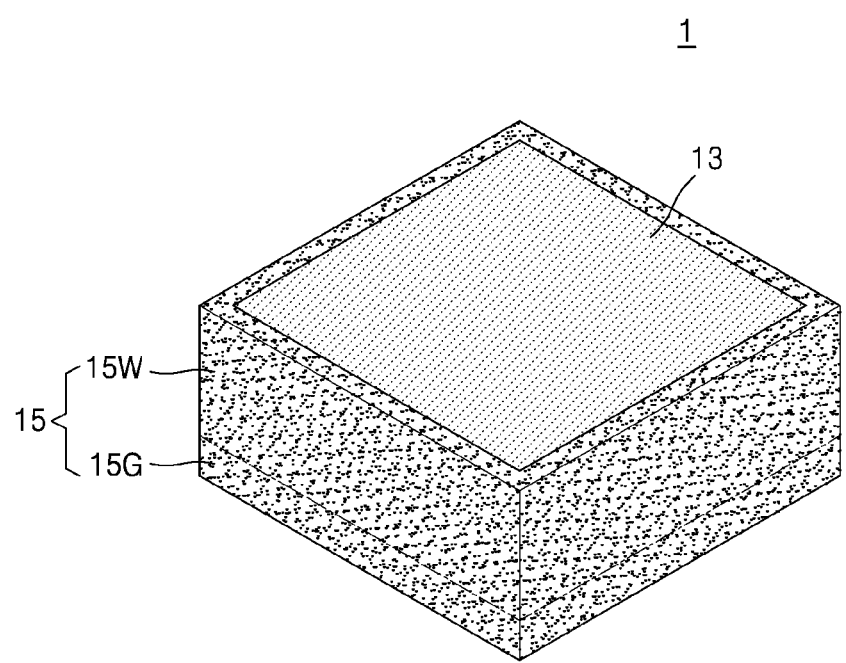
FIGS. 1C and 8B are perspective views of the LED packages shown in FIGS. 1A and 8A, respectively.

FIG. 1A is a cross-sectional view of a light-emitting diode (LED) package 1 according to example embodiments. FIG. 1B is a cross-sectional view of region A of FIG. 1A, which shows structures of a light-emitting structure 11 and an electrode 17 included in the LED package 1, according to an example embodiment. FIG. 1C is a perspective view of the LED package 1 of FIG. 1A.

Referring to FIG. 1A, the LED package 1 may include the light-emitting structure 11, a transmissive material layer 13 formed on the light-emitting structure 11, the electrode 17 connected to a bottom surface 11B of the light-emitting structure 11, and a support structure 15 having a cup shape defining a cavity adjacent a side surface 13S of the transmissive material layer 13, a side surface 11S of the light-emitting structure 11, and a side surface 17S of the electrode 17 and covering at least a portion of the bottom surface 11B of the light-emitting structure 11.

A width 1Wth of the LED package 1 may be substantially equal to a width 15Wth of the support structure 15. That is, the LED package 1 may include the support structure 15 having the cup shape defining a cavity, which covers the transmissive material layer 13, the light-emitting structure 11, and the electrode 17, as an outermost portion. A difference between the width 11Wth of the light-emitting structure 11 and the width 1Wth of the LED package 1 may be much less than the width 11Wth of the light-emitting structure 11. Thus, the LED package 1 having the support structure 15 as the outermost portion may be a chip-scale package (CSP). In some example embodiments, a difference between a width 15Wth of the support structure 15 and the width 11Wth of the light-emitting structure 11 may be less than half the width 11Wth of the light-emitting structure 11.

Referring to FIG. 1B, the light-emitting structure 11 may have a stack structure including a first-conductivity-type semiconductor layer 11L, an active layer 11M, and a second-conductivity-type semiconductor layer 11N. The first-conductivity-type semiconductor layer 11L may include a p-type doped semiconductor, and the second-conductivity-type semiconductor layer 11N may include an n-type doped semiconductor. Conversely, the first-conductivity-type semiconductor layer 11L may include an n-type doped semiconductor, and the second-conductivity-type semiconductor layer 11N may include a p-type doped semiconductor. The first and second-conductivity-type semiconductor layers 11L and 11N may include a nitride semiconductor, for example, $Al_xIn_yGa(1-x-y)N$ ($0<x<1$, $0<y<1$, $0<x+y<1$). However, the first and second-conductivity-type semiconductor layers 11L and 11N may include a GaAs-based semiconductor or a GaP-based semiconductor instead of the nitride semiconductor. Each of the first-conductivity-type semiconductor layer 11L, the active layer 11M, and the second-conductivity-type semiconductor layer 11N may be an epitaxial layer.

Although not shown in FIG. 1A, a rough portion may be formed on the surface of the light-emitting structure 11, on which the transmissive material layer 13 is formed. The rough portion may effectively extract light from the light-emitting structure 11 and improve optical efficiency. The rough portion may be formed by etching the surface of the light-emitting structure 11 during a process of removing a growth substrate from the light-emitting structure 11. The formation of the rough portion will be described in detail later with reference to FIG. 10H.

The active layer 11M interposed between the first and second-conductivity-type semiconductor layers 11L and 11N may emit light having a given (or alternatively, predetermined) energy through a recombination of electrons and holes. The active layer 11M may have a multi-quantum well (MQW) structure (e.g., an InGaN/GaN structure or an AlGaN/GaN structure) in which a quantum well layer and a quantum barrier layer are alternately stacked. Also, the active layer 11M may be a single quantum well (SQW) structure. The light-emitting structure 11 may emit blue light, green light, red light, or ultraviolet (UV) light depending on a material of a compound semiconductor forming the light-emitting structure 11. However, a wavelength conversion layer may be further formed on the light-emitting structure 11 and convert the wavelength of light generated by the light-emitting structure 11 and emit light in various colors.

The first and second-conductivity-type semiconductor layers 11L and 11N may be connected to first and second electrodes 17A and 17B, respectively. Specifically, the first-conductivity-type semiconductor layer 11L may be exposed by a through hole T that penetrates the second-conductivity-type semiconductor layer 11N and the active layer 11M. The first electrode 17A may be formed in a space defined by an insulating layer 12 within the through hole T and connected to the first-conductivity-type semiconductor layer 11L. The insulating layer 12 may be formed on an inner sidewall of the through hole T and a bottom surface of the second-conductivity-type semiconductor layer 11N and prevent or inhibit electrical connection of the first electrode 17A with the active layer 11M and the second electrode 17B. Also, the second-conductivity-type semiconductor layer 11N may be connected to the second electrode 17B through the insulating layer 12 formed on the second-conductivity-type semiconductor layer 11N. Although the present embodiment describes an example in which a first electrode 17A and a second electrode 17B are formed on the same surface of the light-emitting structure 11, the first and second electrodes 17A and 17B may be provided on both surface of the light-emitting structure 11, respectively. Alternatively, any one of the first and second electrodes 17A and 17B may include at least two electrodes.

In some example embodiments, the first and second electrodes 17A and 17B may include a material, such as silver (Ag), nickel (Ni), aluminum (Al), rhodium (Rh), palladium (Pd), iridium (Ir), ruthenium (Ru), magnesium (Mg), zinc (Zn), platinum (Pt), or gold (Au). Each of the first and second electrodes 17A and 17B may have a structure including at least two layers, such as Ni/Ag, Zn/Ag, Ni/Al, Zn/Al, Pd/Ag, Pd/Al, Ir/Ag. Ir/Au, Pt/Ag, Pt/Al, or Ni/Ag/Pt. In some example embodiments, each of the first and second electrodes 17A and 17B may include a seed layer including a material such as Ni or Cr, and include an electrode material (e.g., Au) by using a plating process.

The first-conductivity-type semiconductor layer 11L, the active layer 11M, the second-conductivity-type semiconductor layer 11N, the first electrode 17A, the insulating layer 12, and second electrode 17B shown in FIG. 1B show an example of an electrical connection structure of the light-emitting structure 11 and the electrode 17, but the inventive concepts are not limited thereto. In some example embodiments, the light-emitting structure 11 may be an arbitrary element configured to emit light having a given (or alternatively, predetermined) energy, and the electrode 17 may have various structures configured to transmit energy to the light-emitting structure 11.

The transmissive material layer 13 may be formed in a space defined by the support structure 15 such that the transmissive material layer 13 may contact an inner sidewall of the support structure 15 and contact a top surface of the light-emitting structure 11. The transmissive material layer 13 may include at least one of a wavelength conversion layer having light transmittance and a lens layer.

The wavelength conversion layer may be a phosphor layer. Also, the wavelength conversion layer may include a resin layer including a wavelength conversion material, such as quantum dots (QDs). The wavelength conversion layer may be excited by light emitted by the light-emitting structure 11 and convert at least part of light into light having a different wavelength. The wavelength conversion material may include at least two kinds of materials capable of providing light having different wavelengths. The wavelength conversion layer may convert wavelength of light generated by the light-emitting structure 11 and emit white light. A specific material forming the wavelength conversion layer will be described in detail with reference to FIGS. 14 to 16.

Although FIG. 1A illustrates an example in which a top surface of the transmissive material layer 13 is at the same level as a top surface of the support structure 15, the inventive concepts are not limited thereto. The top surface of the transmissive material layer 13 may be formed at a higher level than the top surface of the support structure 15. In some example embodiments, the top surface of the transmissive material layer 13 may have various shapes, (e.g., a flat shape, a convex shape, or a concave shape) as needed. In some example embodiments, the transmissive material layer 13 may be formed to cover a top surface of a sidewall unit 15W of the support structure 15. The formation of the transmissive material layer 13 will be described in detail later with reference to FIGS. 4, 8A, and 8B.

At least one wavelength conversion layer, at least one lens layer, or a structure including at least one wavelength conversion layer and at least one lens layer may be formed on the light-emitting structure 11. In some example embodiments, the transmissive material layer 13 may have a stack structure of a plurality of wavelength conversion layers. For example, the transmissive material layer 13 may have a stack structure of a first wavelength conversion layer configured to emit green light and a second wavelength conversion layer configured to emit red light. This will be described in detail later with reference to FIGS. 6 and 7.

The lens layer may be an optical member, which may have various structures (e.g., a convex lens or a concave lens) capable of varying an orientation angle. In some example embodiments, the lens may be directly formed on the light-emitting structure 11.

The support structure 15 may have a cup shape defining a cavity adjacent to the side surface 13S of the transmissive material layer 13, the side surface 11S of the light-emitting structure 11, and the electrode 17 and covering at least a portion of the bottom surface 11B of the light-emitting structure 11.

The support structure 15 may include the sidewall unit 15W and a bottom unit 15G. The sidewall unit 15W may be at a higher level than the bottom surface 11B of the light-emitting structure 11 and cover the sidewall 13S of the transmissive material layer 13 and the sidewall 11S of the light-emitting structure 11. The bottom unit 15G may be at a lower level than the bottom surface 11B of the light-emitting structure 11 and partially cover the bottom surface 11B of the light-emitting structure 11. The sidewall unit 15W may include a first sidewall 15W1, which may enclose the sidewall 13S of the transmissive material layer 13, and a second sidewall 15W2, which may enclose the sidewall 11S of the light-emitting structure 11. The first sidewall 15W1 of the sidewall unit 15W may be formed on the second sidewall 15W2 and expose the top surface of the light-emitting structure 11 at a higher level than the top surface of the light-emitting structure 11.

The first sidewall 15W1 of the sidewall unit 15W may be a barrier rib configured to divide a plurality of light-emitting structures 11 from one another during a process of collectively packaging the plurality of light-emitting structures 11 that are aligned adjacent to one another. The transmissive material layer 13 may be formed by using a single dispensing process on each of the plurality of light-emitting structures 11 in a space defined by the sidewall unit 15W. Accordingly, the transmissive material layer 13 formed on each of the plurality of light-emitting structures 11 may be uniformly formed to embody desired color coordinates. That is, when the transmissive material layers 13 are collectively formed on the plurality of light-emitting structures 11 that are aligned adjacent to one another, non-uniform formation of the transmissive material layer 13 according to a position of each of the light-emitting structures 11 may be improved. Also, the sidewall unit 15W may prevent or inhibit light generated by the light-emitting structure 11 from being lost in the side surface of the light-emitting structure 11 and increase luminance.

In some example embodiments, a first thickness T1 of the first sidewall 15W1 of the sidewall unit 15W may be less than or equal to a second thickness T2 of the second sidewall 15W2 thereof.

The support structure 15 may be a resin including high-reflective powder. The high-reflective powder in the support structure 15 may prevent or inhibit light generated by the light-emitting structure 11 from being absorbed into the support structure 15 or lost in a side surface of the light-emitting structure 11 to increase luminance. The high-reflective powder may include high-reflective metal powder, for example, Al powder or Ag powder. The high-reflective metal powder may be appropriately included in the support structure 15 in such a range as to maintain the support structure 15 as an insulating material. Also, the high-reflective powder may include ceramic powder, for example, at least one selected from the group consisting of $TiO_2$, $Al_2O_3$, $Nb_2O_5$, $Al_2O_3$, and ZnO.

In some example embodiments, a bottom unit 15G of the support structure 15 and the second sidewall 15W2 of the sidewall unit 15W may include a material having greater light reflection efficiency than the first sidewall 15W1 of the sidewall unit 15W. A region of the support structure 15, which may surround the light-emitting structure 11, may selectively include a material having high light reflection efficiency so as to increase the luminance of the LED package 1 and simultaneously, reduce the manufacturing cost.

The support structure 15 may be a curing resin or a semi-curing resin. The curing resin may be a resin that remains flowable before a curing process, and may be cured with application of energy, such as heat or UV light. The term "semi-curing" refers to a state in which a resin structure is not completely cured but cured so as to be easily handled and processed. The semi-cured resin structure may be bonded under pressure at an appropriate temperature to the surface of the light-emitting structure 11.

In some example embodiments, the support structure 15 may be one body including the same material. That is, the support structure 15 may be formed by molding the same material. In some example embodiments, the bottom unit 15G of the support structure 15 may include a material having a greater support strength than the sidewall unit 15W thereof. Physical properties of the support structure 15 will be described in detail later with reference to FIG. 5.

The support structure 15 may have an electrical insulation characteristic against the electrode 17 connected to an external circuit. For example, the support structure 15 may be silicone resin, epoxy resin, or a mixture thereof.

Referring to FIG. 1C, the support structure 15 having a cup shape defining a cavity may be formed, the cavity surrounding the light-emitting structure 11, the transmissive material layer 13, and the electrode 17. The sidewall unit 15W of the support structure 15 may prevent or inhibit light generated by the light-emitting structure 11 from being lost and increase luminance. Also, the sidewall unit 15W of the support structure 15 may have a structure capable of forming the transmissive material layer 13 on a wafer level by using a single dispensing process. Thus, each LED package 1 manufactured on a wafer level may have desired color coordinates.

In general, in a CSP manufactured on a wafer level, the number of LEDs that may be ensured within a wafer area may be closely related to the manufacturing cost. However, as the number of LEDs increases within the wafer area, a distance between adjacent LEDs may be reduced. Thus, a distance from an edge of an LED to an edge of an LED package may be reduced so that a light reflection region may be reduced and optical loss may occur. That is, the number of LEDs formed within the wafer area may be in a trade-off relationship with luminance. Also, when a transmissive material layer is coated on the whole surface of a wafer, as the area of the wafer increases, there may be a specific limit to manufacturing an LED package in which each LED has uniform color coordinates.

In contrast, the LED package 1 according to an example embodiment may include the support structure 15 having the cup shape defining a cavity, which includes the sidewall unit 15W. Thus, optical loss of LED packages due to a wafer-level packaging process may be inhibited, and each of the LED packages may have desired color coordinates. That is, the manufacturing cost may be reduced, and the quality of the LED packages may be improved.

Figure 2:
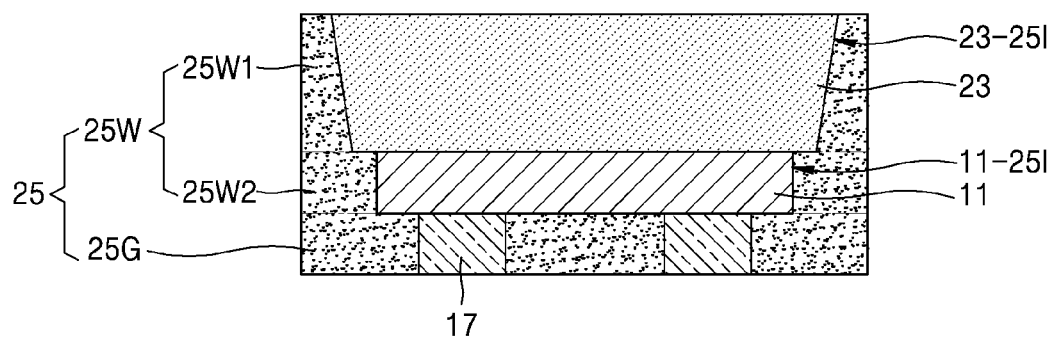

FIG. 2 is a cross-sectional view of an LED package 2 according to example embodiments. The LED package 1 of FIG. 2 may be similar to the LED package 1 described with reference to FIG. 1 except that a portion of an inner sidewall of a support structure 25 has a slope. The same reference numerals are used to denote the same elements, and repeated descriptions thereof will be simplified.

Referring to FIG. 2, the support structure 25 may include a sidewall unit 25W and a bottom unit 25G. The sidewall unit 25W may be at a higher level than a bottom surface of a light-emitting structure 11 and cover a sidewall of the transmissive material layer 23 and a sidewall of the light-emitting structure 11. The bottom unit 25G may be at a lower level than the bottom surface of the light-emitting structure 11 and partially cover the bottom surface of the light-emitting structure 11. The sidewall unit 25W may include a first sidewall 25W1, which may surround the sidewall of the transmissive material layer 23, and a second sidewall 25W2, which may surround the sidewall of the light-emitting structure 11. The first sidewall 25W1 of the sidewall unit 25W may be formed on the second sidewall 25W2 and expose a top surface of the light-emitting structure 11 at a higher level than the top surface of the light-emitting structure 11.

An interface 23-25I between the sidewall unit 25W and the transmissive material layer 23 may have a slope. That is, the first sidewall 25W1 covering a sidewall of the transmissive material layer 23 may widen from an upper portion of the first sidewall 25W1 to a lower portion thereof. In this case, an interface 11-25I between the sidewall unit 25W and the light-emitting structure 11 may not have a slope, but the inventive concepts are not limited thereto.

FIG. 2 illustrates a case in which the interface 23-25I between the sidewall unit 25W and the transmissive material layer 23 has a slope with a constant gradient, but the inventive concepts are not limited thereto. In some example embodiments, the interface 23-25I between the sidewall unit 25W and the transmissive material layer 23 may have a slope with a plurality of gradients.

Figure 3:
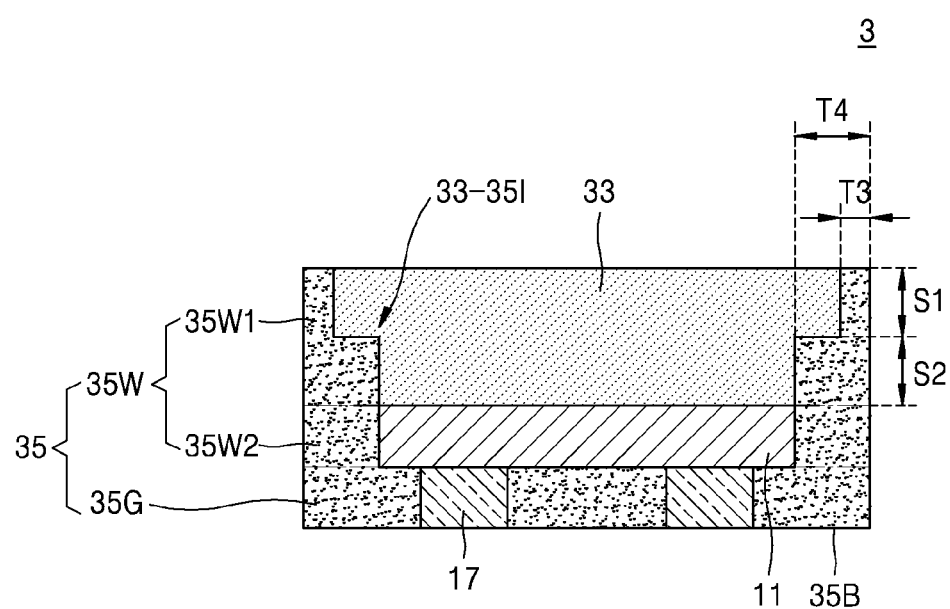

FIG. 3 is a cross-sectional view of an LED package 3 according to example embodiments. The LED package 3 of FIG. 3 may be similar to the LED package 1 described with reference to FIG. 1 except that a portion of an inner sidewall of a support structure 35 has a stepped shape.

Referring to FIG. 3, the support structure 35 may include a sidewall unit 35W and a bottom unit 35G. The sidewall unit 35W may be at a higher level than a bottom surface of a light-emitting structure 11 and cover a sidewall of the transmissive material layer 33 and a sidewall of the light-emitting structure 11. The bottom unit 35G may be at a lower level than the bottom surface of the light-emitting structure 11 and partially cover the bottom surface of the light-emitting structure 11.

The sidewall unit 35W may include a first sidewall 35W1, which may surround a sidewall of the transmissive material layer 33, and a second sidewall 35W2, which may surround a sidewall of the light-emitting structure 11. The first sidewall 35W1 of the sidewall unit 35W may be formed on the second sidewall 35W2 and expose a top surface of the light-emitting structure 11 at a higher level than the top surface of the light-emitting structure 11.

In this case, the first sidewall 35W1 may be divided into a first section S1 including a top surface of the first sidewall 35W1 and a second section S2 that is in contact with a top surface of the second sidewall 35W2, and a third thickness T3 of the first section S1 may be less than a fourth thickness T4 of the second section S2. Thus, an interface 33-35I between the transmissive material layer 33 and the sidewall unit 35W may have a stepped shape.

Figure 4:
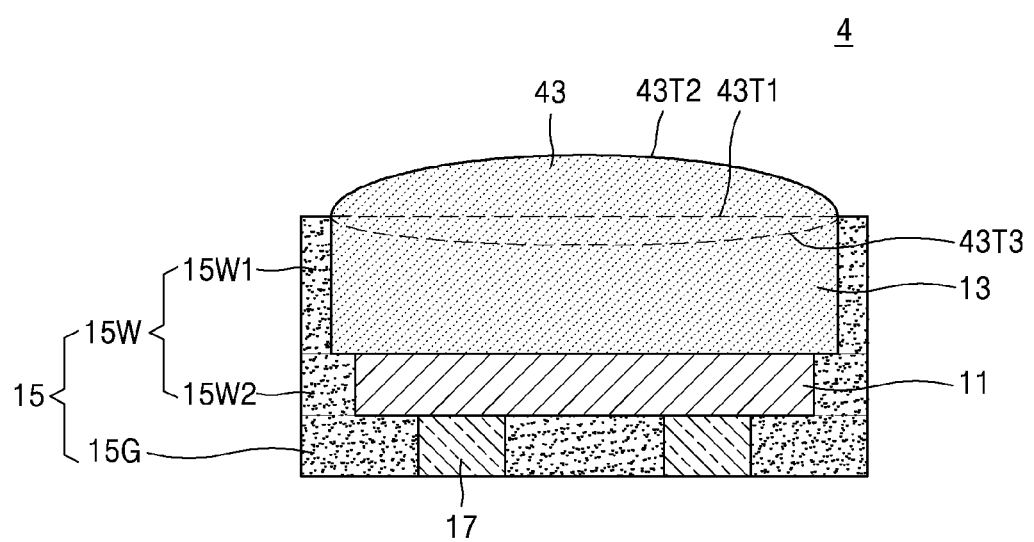

FIG. 4 is a cross-sectional view of an LED package 4 according to example embodiments. The LED package 4 of FIG. 4 may be similar to the LED package 1 described with reference to FIG. 1 except that a top surface of a transmissive material layer 43 has a convex shape.

Referring to FIG. 4, the LED package 4 may include a light-emitting structure 11, the transmissive material layer 43 formed on the light-emitting structure 11 and having a convex top surface 43T2, an electrode 17 connected to a bottom surface of the light-emitting structure 11, and a support structure 15 having a cup shape defining a cavity adjacent to a side surface of the transmissive material layer 43, a side surface of the light-emitting structure 11, and the electrode 17 and partially cover at least a portion of a bottom surface of the light-emitting structure 11. The convex top surface 43T2 of the transmissive material layer 43 may condense light generated by the light-emitting structure 11 to a central portion of the transmissive material layer 43 and increase luminance. The convex top surface 43T2 of the transmissive material layer 43 may be at a higher level than a top surface of the sidewall unit 15W of the support structure 15.

FIG. 4 illustrates a case in which the transmissive material layer 43 has the convex top surface 43T2, but the inventive concepts are not limited thereto. A top surface of the transmissive material layer 43 may have various structures capable of varying an orientation angle of light as needed. In some example embodiments, the transmissive material layer 43 may have a flat top surface 43T1 or a concave top surface 43T3.

As described above, the transmissive material layer 43 may include a wavelength conversion layer and/or a lens layer.

Figure 5:
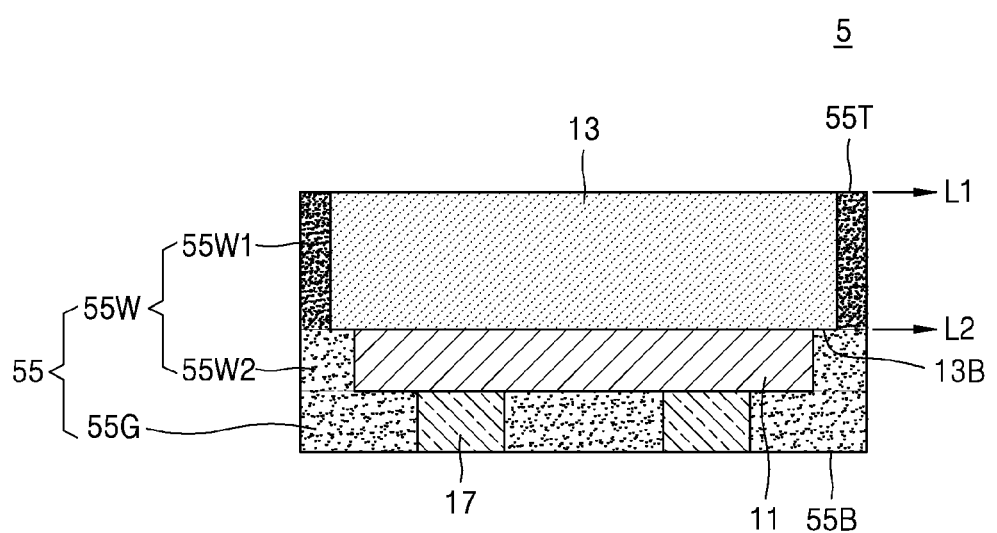

FIG. 5 is a cross-sectional view of an LED package 5 according to example embodiments. The LED package 5 of FIG. 5 may be similar to the LED package 1 described with reference to FIG. 1 except that a support structure 55 has a stack structure of a plurality of different materials.

Referring to FIG. 5, the support structure 55 may include a plurality of material layers, which may be stacked in a direction perpendicular to a main surface of the light-emitting structure 11. That is, the support structure 55 may include a second material from a bottom surface 55B of the support structure 55 to a second level L2 and include a first material from the second level L2 to a first level L1. In this case, the first level L1 may be higher than the second level L2, and the first material may be different from the second material.

The first level L1 may be at the same level as a top surface 55T of the support structure 55. In this case, a lower portion and an upper portion of the support structure 55 may include the second material and the first material, respectively, based on the second level L2.

The second level L2 may be at substantially the same level as a bottom surface 13B of the transmissive material layer 13 or a top surface of the light-emitting structure 11. Thus, a side surface of the light-emitting structure 11 may be surrounded by a second sidewall 55W2 and a bottom unit 55G of the support structure 55, which include the second material, while the transmissive material layer 13 may be surrounded by a first sidewall 55W1 of the support structure 55, which includes the first material.

In this case, the second material may include a material having greater light reflection efficiency than the first material. Accordingly, light generated by the light-emitting structure 11 may be effectively reflected and prevented or inhibited from being absorbed into the support structure 55 or lost in the side surface of the light-emitting structure 11. That is, a region of the support structure 15, which may surround the light-emitting structure 11, may selectively include a material having high light reflection efficiency so as to increase the luminance of the LED package 5 and simultaneously, reduce the manufacturing cost.

The second material may be a resin including high-reflective powder. The high-reflective powder may include metal powder having high reflectivity, for example, aluminum (Al) powder or silver (Ag) powder. The high-reflective metal powder may be appropriately included in the support structure 55 in such a range as to maintain the support structure 55 as an insulating material. Also, the high-reflective powder may include ceramic powder, for example, at least one selected from the group consisting of $TiO_2$, $Al_2O_3$, $Nb_2O_5$, $Al_2O_3$, and ZnO.

The first material may be a resin including the high-reflective powder at a lower concentration than the second material. Alternatively, the first material and the second material may include silicone resin, epoxy resin, or a mixture thereof.

Although FIG. 5 illustrates a case in which the second level L2 is the same as a level of the bottom surface 13B of the transmissive material layer 13, the inventive concepts are not limited thereto. In some embodiments, the second level L2 may substantially range from a level of a bottom surface 11B of the light-emitting structure 11 to a level of the bottom surface 13B of the transmissive material layer 13. However, the second level L2 may be higher than the bottom surface 13B of the transmissive material layer 13 as needed. In this case, the second material having high light reflection efficiency may surround not only the light-emitting structure 11 but also a portion of the transmissive material layer 13.

In the LED package 2, a lower portion of the support structure 55, which may have relatively high necessity of reflecting light generated by the light-emitting structure 11, may include a material having high light reflection efficiency, while an upper portion of the support structure 55, which has relatively low necessity of reflecting light and requires structural stability, may include a material having relatively low light reflection efficiency and high support strength. Thus, the manufacturing cost may be reduced, and the quality of the LED package 2 may be improved.

Figure 6:
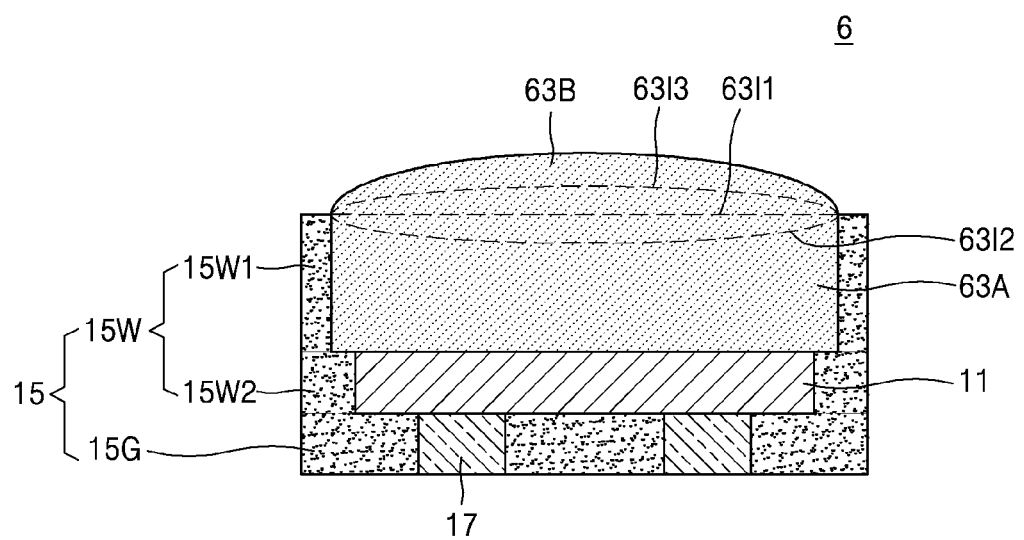

FIG. 6 is a cross-sectional view of an LED package 6 according to example embodiments. The LED package 6 of FIG. 6 may be similar to the LED package 1 described with reference to FIG. 1 except that a plurality of transmissive material layers, for example, first and second transmissive material layers 63A and 63B, are stacked on a light-emitting structure 11.

Referring to FIG. 6, the first transmissive material layer 63A may be formed in a space defined by a support structure 15 such that the first transmissive material layer 63A contacts an inner sidewall of a support structure 15 and a top surface of the light-emitting structure 11. Also, the second transmissive material layer 63B including a different material from the first transmissive material layer 63A may be formed on the first transmissive material layer 63A.

The first transmissive material layer 63A may be a wavelength conversion layer, and the second transmissive material layer 63B may be a lens layer. The second transmissive material layer 63B, which may serve as an optical member, may be a convex lens layer, a concave lens layer, or a flat lens layer. The second transmissive material layer 63B may have various structures capable of varying an orientation angle of light as needed.

Conversely, the first transmissive material layer 63A may be a lens layer, and the second transmissive material layer 63B may be a wavelength conversion layer.

Although the first transmissive material layer 63A and the second transmissive material layer 63B are formed such that there is a flat interface 6311 between the first and second transmissive material layers 63A and 63B, the inventive concepts are not limited thereto. In some embodiments, the first transmissive material layer 63A and the second transmissive material layer 63B may be formed such that there is a concave interface 6312 or convex interface 63B between the first and second transmissive material layers 63A and 63B.

FIG. 6 illustrates a case in which the entire first transmissive material layer 63A is in contact with an inner sidewall of the support structure 15 and the second transmissive material layer 63B is not in contact with the inner sidewall of the support structure 15, but the inventive concepts are not limited thereto. In some embodiments, the first transmissive material layer 63A may be formed in a space defined by the support structure 15 and contact a lower portion of the inner sidewall of the support structure 15. The second transmissive material layer 63B may be formed in a space defined by the support structure 15 and contact an upper portion of the inner sidewall of the support structure 15.

Although FIG. 6 illustrates only two transmissive material layers, the inventive concepts are not limited thereto, and at least three transmissive material layers may be formed. In some embodiments, the at least three transmissive material layers may have a stack structure of at least one wavelength conversion layer and at least one lens layer.

Figure 7:
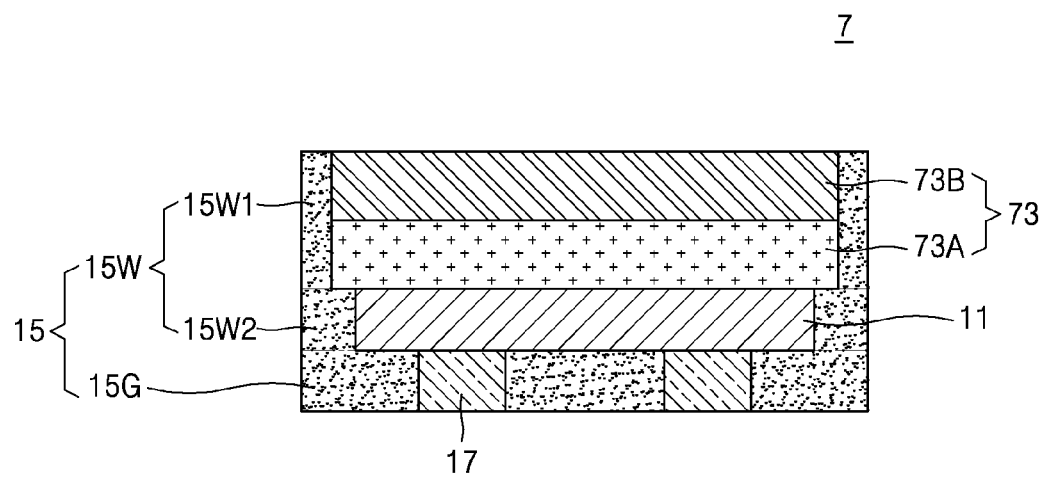

FIG. 7 is a cross-sectional view of an LED package 7 according to example embodiments. The LED package 7 of FIG. 7 may be similar to the LED package 1 described with reference to FIG. 1 except that a plurality of wavelength conversion layers, for example, first and second wavelength conversion layers 73A and 73B, are stacked on a light-emitting structure 11.

Referring to FIG. 7, the first wavelength conversion layer 73A and the second wavelength conversion layer 73B may be stacked in a space defined by a support structure 15 and contact an inner sidewall of the support structure 15 and a top surface of the light-emitting structure 11.

In some embodiments, the first wavelength conversion layer 73A may include a wavelength conversion material configured to emit green light, and the second wavelength conversion layer 73B may include a wavelength conversion material configured to emit red light. In this case, the first wavelength conversion layer 73A may be disposed on the second wavelength conversion layer 73B. A stack structure of the first wavelength conversion layer 73A configured to emit green light and the second wavelength conversion layer 73B configured to emit red light may convert light generated by the light-emitting structure 11 into white light and output the white light.

Although FIG. 7 illustrates only two wavelength conversion layers, the inventive concepts are not limited thereto and at least three wavelength conversion layers may be formed. Also, the at least three wavelength conversion layers may be at least two kinds of wavelength conversion layers. In some embodiments, the at least three wavelength conversion layers may have a structure in which two kinds of wavelength conversion layers are alternately stacked.

Figure 8A:
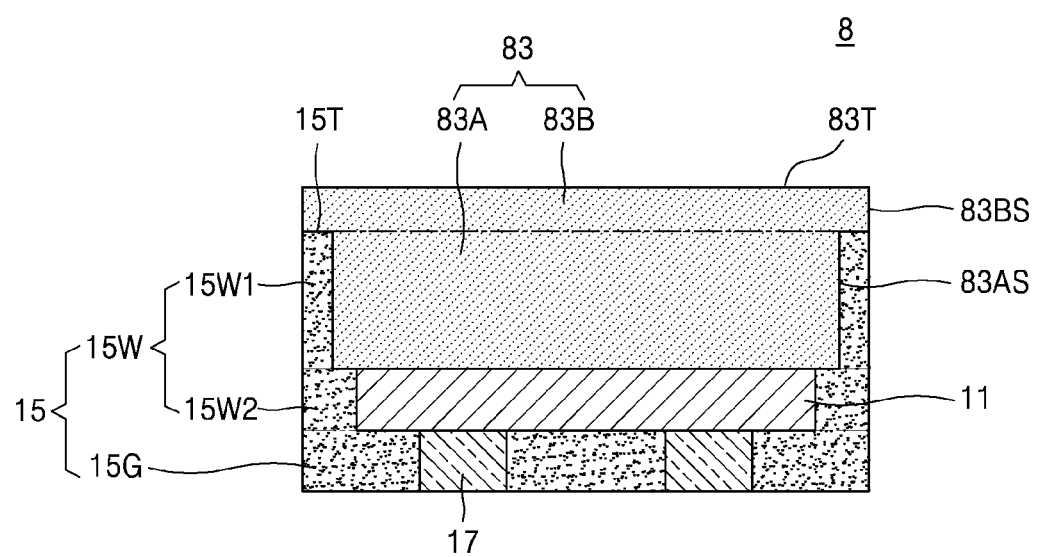
Figure 8B:
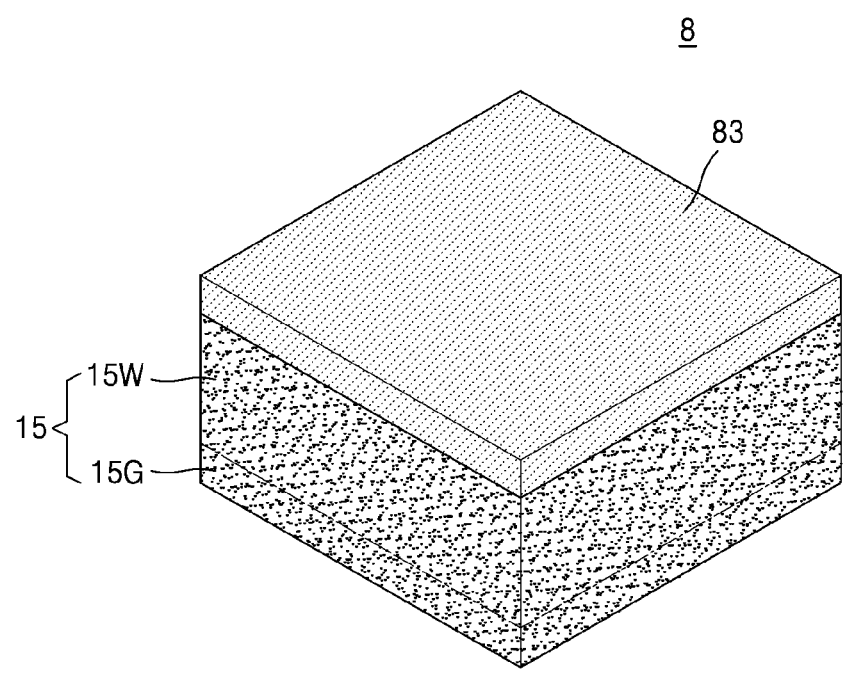

FIGS. 8A and 8B respectively are a cross-sectional view and a perspective view of an LED package 8 according to example embodiments. The LED package 8 of FIGS. 8A and 8B may be similar to the LED package 1 of FIGS. 1A and 1B except that a transmissive material layer 83 covers a top surface 15T of a sidewall unit 15W of a support structure 15.

Referring to FIG. 8A, the transmissive material layer 83 of the LED package 8 may include a first portion 83A and a second portion 83B. The first portion 83A may be formed on a light-emitting structure 11 in a space defined by the sidewall unit 15W of the support structure 15. The second portion 83B may be formed to cover the first portion 83A and the top surface 15T of the sidewall unit 15W. That is, a top surface 83T of the transmissive material layer 83 may be formed at a higher level than the top surface 15T of the sidewall unit 15W.

Although FIG. 8A illustrates a case in which a top surface of the second portion 83B of the transmissive material layer 83 has a flat shape, the inventive concepts are not limited thereto. In some embodiments, the top surface of the second portion 83B of the transmissive material layer 83 may have a convex shape or a concave shape.

The transmissive material layer 83 including the first portion 83A and the second portion 83B may include at least one wavelength conversion layer and/or at least one lens layer.

Referring to FIG. 8B, the transmissive material layer 83 may be formed to cover a top surface of the support structure 15 having a cup shape defining a cavity. The sidewall unit 15W of the support structure 15 may be configured to form the transmissive material layer 83 by using a single dispensing process on a wafer level. Thus, each LED package 8 manufactured on a wafer level may have desired color coordinates. Also, the sidewall unit 15W of the support structure 15 may prevent or inhibit light generated by the light-emitting structure 11 from being lost and increase luminance.

FIG. 9 is a flowchart of a method of manufacturing an LED package, according to example embodiments. FIGS. 10A to 10J are cross-sectional views of process operations of a method of manufacturing the LED package 1 shown in FIGS. 1A and 1B, according to an example embodiment. FIG. 10C is an enlarged cross-sectional view of region B of FIG. 10B, which illustrates structures of a preliminary light-emitting structure p11 and an electrode 17. The same reference numerals are used to denote the same elements, and repeated descriptions thereof will be omitted.

Figure 10A:
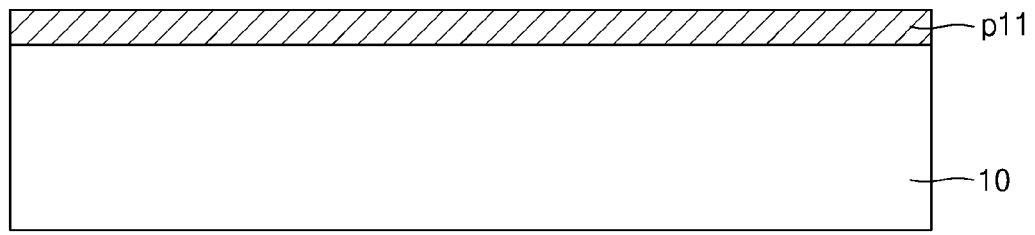
FIGS. 10A to 10J are cross-sectional views of process operations of a method of manufacturing the LED package shown in FIGS. 1A and 1B.
Figure 10B:
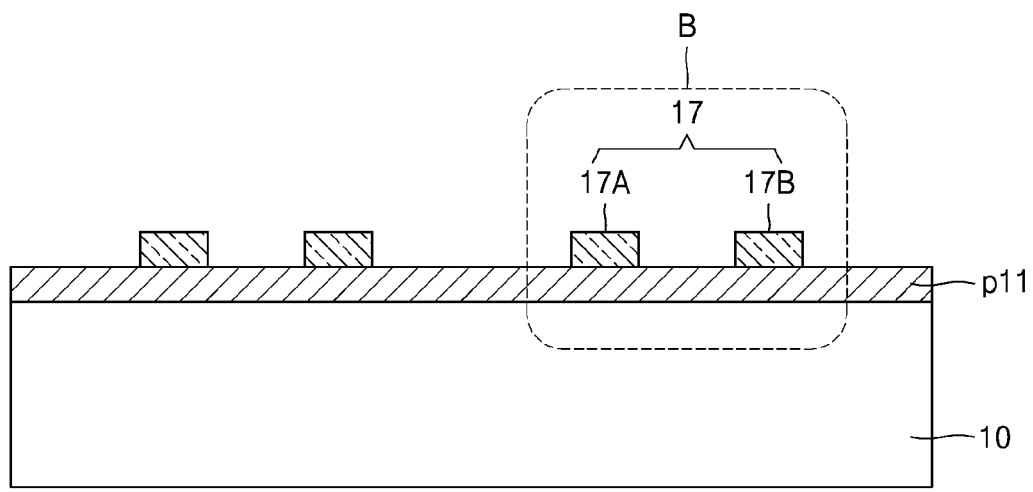
Figure 10C:
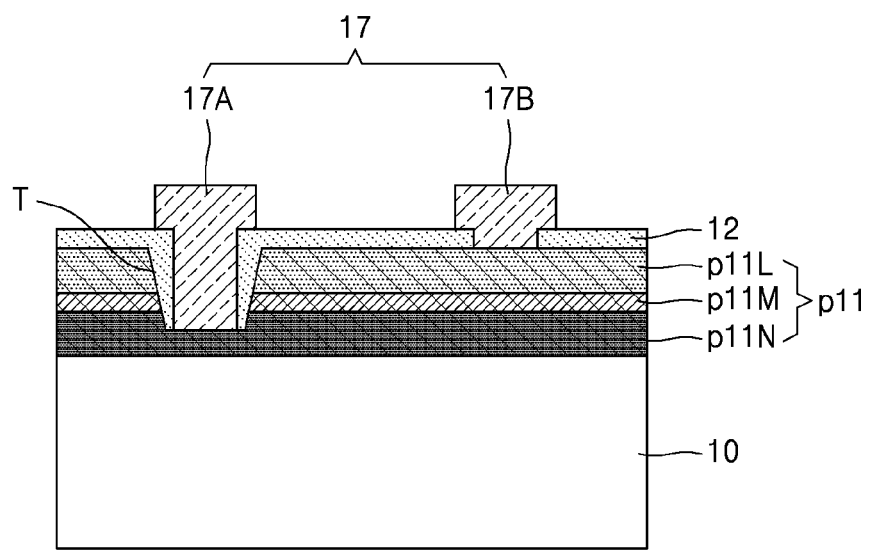

Referring to FIGS. 9, 10A, and 10C, a preliminary light-emitting structure p11 may be formed on a growth substrate 10 (S101).

The growth substrate 10 may be an insulating substrate, a conductive substrate, or a semiconductor substrate. For example, the growth substrate 10 may include sapphire (Al2O3), SiC, Si, MgAl2O4, MgO, LiAlO2, LiGaO2, GaN, or SiAl.

A preliminary first-conductivity-type semiconductor layer p11L, a preliminary active layer p11M, and a preliminary second-conductivity-type semiconductor layer p11N may be sequentially formed on the growth substrate 10. The preliminary first and second-conductivity-type semiconductor layers p11L and p11N may be formed by doping an n-type dopant and a p-type dopant, respectively. Conversely, the preliminary first and second-conductivity-type semiconductor layers p11L and p11N may be formed by doping a p-type dopant and an n-type dopant, respectively.

Referring to FIGS. 9, 10B, and 10C, an electrode 17 may be formed on the preliminary light-emitting structure p11 (S103).

Referring to FIG. 10C, first and second electrodes 17A and 17B may be connected to first and second-conductivity-type semiconductor layers 11L and 11N, respectively. Specifically, a through hole T may be formed to penetrate the active layer 11M and the second-conductivity-type semiconductor layer 11N and expose at least a portion of the first-conductivity-type semiconductor layer 11L. The through hole H may be formed by using an etching process, such as a reactive ion etching (RIE) process, or laser and mechanical drilling processes.

An insulating layer 12 may be formed to cover an inner sidewall of the through hole T and an exposed surface of the second-conductivity-type semiconductor layer 11N. The insulating layer 12 may prevent or inhibit electrical connection of the first electrode 17A with the active layer 11M and the second electrode 17B. The first electrode 17A may be formed in a space defined by the insulating layer 12 within the through hole T and connected to the first-conductivity-type semiconductor layer 11L. The second electrode 17B may penetrate the insulating layer 12 covering the second-conductivity-type semiconductor layer 11N and be connected to the second-conductivity-type semiconductor layer 11N. Each of the first and second electrodes 17A and 17B may be formed to a greater width on the insulating layer 12 than in the other position.

The present embodiment describes an example in which a first electrode 17A and a second electrode 17B are formed on the same surface of the preliminary light-emitting structure p11. However, in other embodiments, the first and second electrodes 17A and 17B may be provided on both surface of the preliminary light-emitting structure p11, respectively. Alternatively, the first and second electrodes 17A and 17B may include at least two electrodes.

The first and second electrodes 17A and 17B may be formed on discrete LED chips, respectively.

Figure 10D:
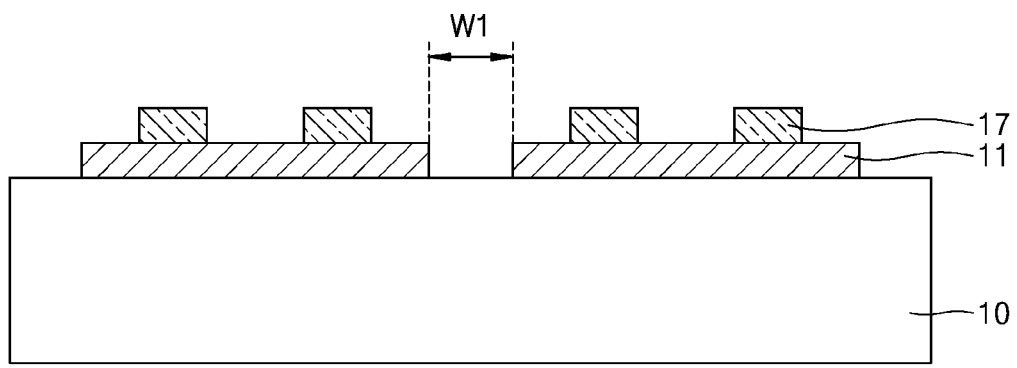

Referring to FIG. 10D, the preliminary light-emitting structure p11, which is wafer-level, of FIG. 10C may be separated into discrete LEDs to form a plurality of light-emitting structures 11 (S105). In this case, the separation process may be performed such that each of the light-emitting structures 11 includes at least a pair of electrodes, namely, the first electrode 17A and the second electrode 17B The separation process may be performed by using an etching process to prevent or inhibit the occurrence of cracks in the light-emitting structures 11.

Due to the separation process, adjacent light-emitting structures 11 may be spaced a first width W1 apart from one another. In this case, a top surface of the growth substrate 10 may be exposed between the adjacent light-emitting structures 11. Although not shown in FIG. 10D, the top surface of the growth substrate 10, which is exposed between the adjacent light-emitting structures 11, may be partially etched due to the separation process.

Figure 10E:
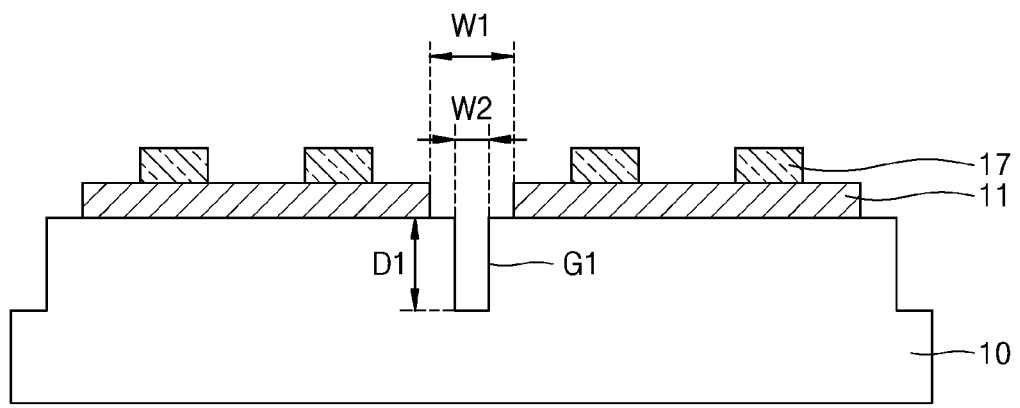

Referring to FIG. 10E, a first dicing process may be performed so that a groove G1 may be formed in an upper portion of the growth substrate 10 that is exposed between the adjacent light-emitting structures 11 due to the separation process (S107).

In this case, the groove G1 may be formed to a depth D1, which is less than a thickness of the growth substrate 10, so that discrete light-emitting structures 11 may not be completely separated from one another. The depth D1 of the groove G1, which is determined in the first dicing process, may be a height of the sidewall unit 15W of FIGS. 1A to 1C. A second width W2 of the groove G1 may be less than or equal to the first width W1 between the adjacent light-emitting structures 11.

The first dicing process may be performed by using a blade wheel, a laser, or an etching process. When the blade wheel is used, a diamond-tipped saw may be in contact with the surface of the growth substrate 10 so that the groove G1 may be formed in the growth substrate 10. The blade wheel may be repetitively used to form the groove G1 between light-emitting structures 11, which are adjacent to one another in horizontal and vertical directions. A thickness of the blade wheel may be selected according to a desired width of the groove G1.

The first dicing process may be performed by using a laser. In this case, the width of the groove G1 may be adjusted by varying the output of the laser as needed.

Also, the first dicing process may be formed by using an etching process. A mask pattern defining a desired groove G1 may be formed on the resultant structure of FIG. 10D by using a lithography process, and an upper portion of the growth substrate 10 may be etched to form the groove G1. In this case, the width of the groove G1 may be adjusted by controlling the amount and/or supply voltage of the etch gas.

When the groove G is formed by using the etching process, mechanical oscillation may not occur so that cracks may occur in the light-emitting structure 11 or propagate from edges of the groove G1.

In some embodiments, the first dicing process (S107) for forming the groove G1 may be performed simultaneously with a separation process (S105) (e.g., an etching process) for separating light-emitting structures 11. In this case, the first width W1 may be substantially equal to the second width W2.

Figure 10F:
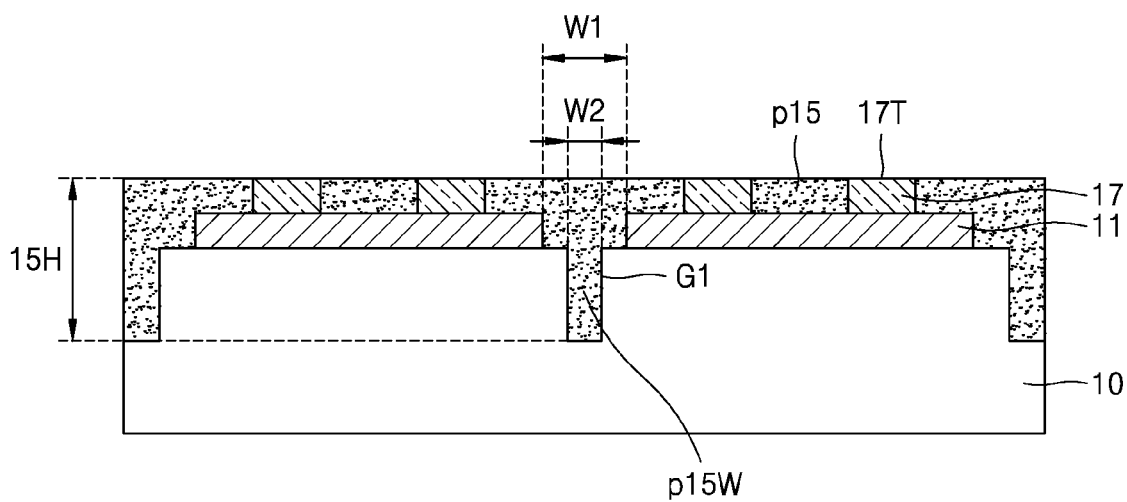

Referring to FIG. 10F, a preliminary support structure p15 may be formed to fill the groove G1 formed in the growth substrate 10 and cover a sidewall of the light-emitting structure 11 and a side surface of the electrode 17 (S109).

Specifically, the preliminary support structure p15 may be formed to fill the groove G1 formed at the second width W2 in the growth substrate 10, a space between adjacent light-emitting structures 11 formed the first width W1 apart from each other, and spaces between a plurality of electrodes 17 and expose top surfaces 17T of the electrodes 17.

A material of the preliminary support structure p15 filled in the groove G1 of the growth substrate 10 may form a preliminary sidewall unit p15W. Also, a height of the preliminary support structure p15, which is determined during a process of injecting a support structure material, may be a height of the support structure 15 shown in FIGS. 1A to 1C. The preliminary support structure p15 may have a height 15H from a bottom surface of the groove G1 to the top surface 17T of the electrode 17. Although FIG. 10F illustrates a case in which a top surface of the preliminary support structure p15 is at the same level as the top surface 17T of the electrode 17, the inventive concepts are not limited thereto. The top surface of the preliminary support structure p15 may be formed at a higher level than the top surface 17T of the electrode 17. In this case, a conductive structure electrically connected to the electrode 17 may be further formed through the preliminary support structure p15.

The preliminary support structure p15 may include a curing resin or a semi-curing resin. The curing resin may be resin that remains flowable before a curing process, and may be cured with application of energy, such as heat or UV light. The curing resin may be resin that is formed by coating a liquid resin by using various coating processes, for example, a spin coating process, a screen process, an inkjet printing process, or a dispensing process, and curing the coated liquid resin. The semi-curing resin may be formed by adhering a semi-cured resin structure to a surface on which the electrode 17 is formed. The term "semi-curing" refers to a state in which a resin structure is not completely cured but cured so as to be easily handled and processed. The semi-cured resin structure may be bonded under pressure at an appropriate temperature to the surface of the light-emitting structure 11.

The preliminary support structure p15 may include a resin material including high-reflective powder. The high-reflective powder may be metal powder or ceramic powder having high reflectivity. The high-reflective metal powder may be appropriately included in such a range as to maintain the support structure 15 as an insulating material. A material of the preliminary support structure p15 is the same as described with reference to FIG. 1A.

Figure 10G:
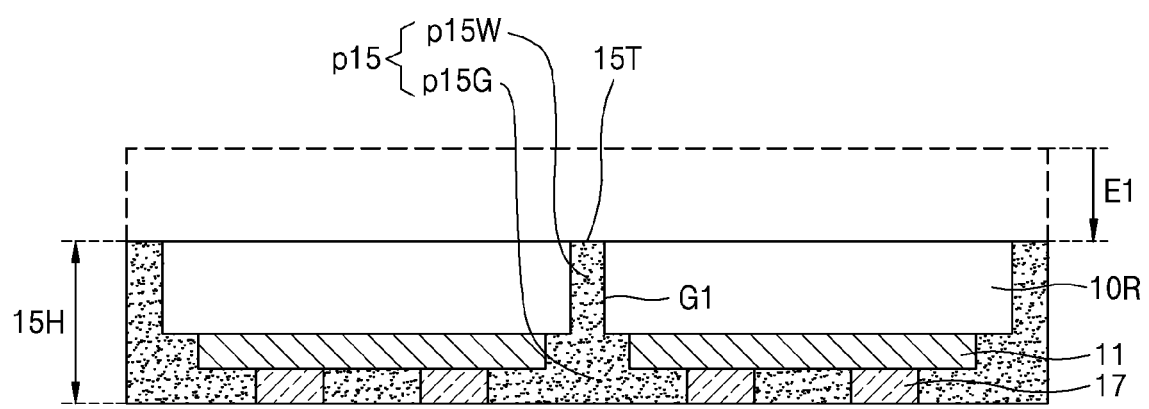
Figure 10H:
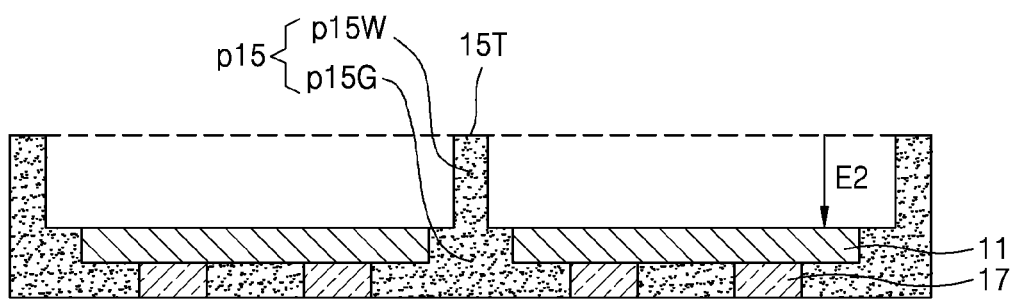

Referring to FIGS. 10G and 10H, the growth substrate 10 may be removed by overturning the resultant structure of FIG. 10F (S111). The growth substrate 10 may be removed by using a mechanical or chemical etching process. In this case, the growth substrate 10 may be removed by using a chemical mechanical polishing (CMP) process E1 to a level equal to the height 15H of the top surface 15T of the preliminary sidewall unit p15W of the preliminary support structure p15. Thereafter, the remaining growth substrate 10R, which is filled in a space defined by the preliminary sidewall unit p15W, may be selectively removed by using a chemical etching process E2 at a level lower than the height 15H of the top surface 15T of the sidewall unit p15W.

By removing the growth substrate 10, the preliminary support structure p15 may have a closed barrier rib structure or a closed cell structure and expose top surfaces of a plurality of light-emitting structures 11 and isolate each of the light-emitting structures 11. The preliminary sidewall unit p15W may be shared between adjacent light-emitting structures 11.

Although not shown in FIG. 10H, a rough portion may be formed on the surface of the light-emitting structure 11 during a process of removing the growth substrate 10 from the light-emitting structure 11. The rough portion may be formed during a process of removing the remaining growth substrate 10R, which is filled in the space defined by the preliminary sidewall unit p15W, by using the chemical etching process E2. Alternatively, the rough portion may be formed by performing an additional etching process on the surface of the light-emitting structure 11. The rough portion may effectively extract light from the light-emitting structure 11 and increase optical efficiency.

In some embodiments, a portion of the growth substrate 10 may be separated from a structure including the light-emitting structure 11 and the preliminary support structure p15 by using a laser lift-off process.

Figure 10I:
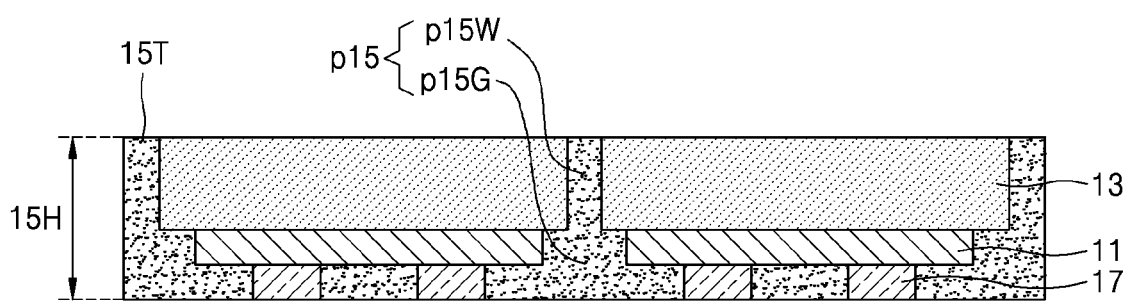

Referring to FIG. 10I, a transmissive material layer 13 may be formed in a space defined by an inner sidewall of the preliminary support structure p15 and the light-emitting structure 11 (S113).

The transmissive material layer 13 may be formed in each of preliminary support structures p15 having closed barrier rib structures by using a single dispensing process. Accordingly, even if a plurality of LED packages 1 are collectively manufactured on a wafer level, the respective transmissive material layers 13 may be uniformly formed to embody desired color coordinates. That is, when the transmissive material layers 13 are collectively formed on a plurality of light-emitting structures 11 that are aligned adjacent to one another, non-uniform formation of the transmissive material layer 13 according to a position of each of the light-emitting structures 11 may be improved.

As described above, the transmissive material layer 13 may include at least one of a wavelength conversion layer having light transmittance and a lens layer.

FIG. 10I illustrates a case in which a top surface of the transmissive material layer 13 has a flat shape and is formed at the same level as a top surface of the preliminary support structure p15, but the inventive concepts are not limited thereto as described in detail later.

Figure 10J:
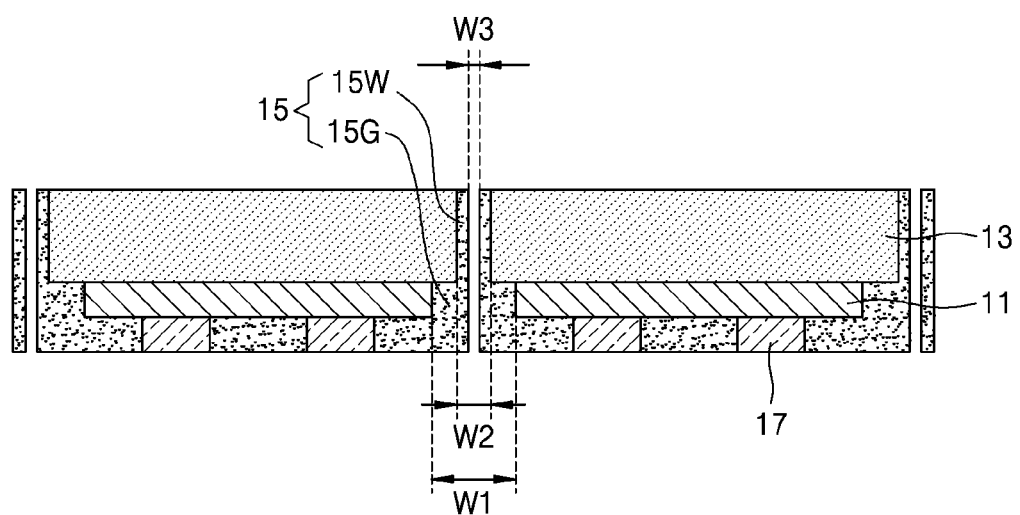

Referring to FIG. 10J, a second dicing process may be performed along the top surface 15T of the sidewall unit p15W of the preliminary support structure p15 of FIG. 10I so that discrete LED packages 1 may be separated from one another (S115).

Specifically, a wafer-level structure including the light-emitting structure 11, the transmissive material layer 13, the electrode 17, and the preliminary support structure p15 covering the light-emitting structure 11, the transmissive material layer 13, and the electrode 17 may be mounted on a cutting stage. Thereafter, a singulation process for separating the wafer-level structure including the light-emitting structure 11, the transmissive material layer 13, the electrode 17, and the preliminary support structure p15 covering the light-emitting structure 11, the transmissive material layer 13, and the electrode 17 into discrete LED packages 1 may be performed. Discrete LEDs may be divided from one another by the preliminary sidewall unit p15W of the preliminary support structure p15 having a closed barrier rib structure. Accordingly, the singulation process may cut the preliminary support structure p15 along the top surface of the preliminary sidewall unit p15W and singulate the LED packages 1. The preliminary sidewall unit p15W may be separated by using the singulation process into sidewall units 15W of the respective discrete LED packages 1.

The singulation process may include a sawing process using a sawing blade wheel or a cutting process using a pattern blade. A shape or width of the blade may be variously selected as needed. However, the preliminary sidewall unit p15 may be removed by as much as a width W3 according to a width of the blade wheel. Accordingly, to leave the sidewall unit 15W of the support structure 15, the width W3 of a portion of the preliminary sidewall unit p15, which is removed by the blade wheel, may be less than the width W2 of the preliminary sidewall unit p15.

FIGS. 9 to 10J illustrate an example in which the LED package 1 is manufactured on a wafer level, but methods of manufacturing the LED packages 1 to 8 according to example embodiments are not limited thereto.

A method of manufacturing the LED package 4 of FIG. 4 will now be described with reference to FIGS. 10A to 10J. The LED package 4 of FIG. 4 may be similar to the LED package 1 shown in FIGS. 1A and 1B, which is manufactured by performing the process operations of FIGS. 10A to 10J as described above. However, in FIG. 10I, a top surface of the transmissive material layer 13 may be adjusted to have a convex shape or a concave shape by using a single dispensing process. Thus, the transmissive material layer 43 having the shape shown in FIG. 4 may be obtained.

A method of manufacturing the LED package 6 of FIG. 6 will now be described with reference to FIGS. 10A to 10J. The LED package 6 of FIG. 6 may be similar to the LED package 1 shown in FIGS. 1A and 1B, which is manufactured by performing the process operations of FIGS. 10A to 10J as described above. However, in FIG. 10I, a first transmissive material layer 63A may be formed in the preliminary support structure p15 having a closed barrier rib structure, and a second transmissive material layer 63B may be then formed on the first transmissive material layer 63A.

A method of manufacturing the LED package 7 of FIG. 7 will now be described with reference to FIGS. 10A to 10J. The LED package 7 of FIG. 7 may be similar to the LED package 1 of FIGS. 1A and 1B, which is manufactured by performing the process operations of FIGS. 10A to 10J as described above. However, in FIG. 10I, a first wavelength conversion layer 73A may be formed in the preliminary support structure p15 having a closed barrier rib structure, and a second wavelength conversion layer 73B may be then formed on the first wavelength conversion layer 73A.

A method of manufacturing the LED package 8 of FIGS. 8A and 8B will now be described with reference to FIGS. 10A to 10J. The LED package 8 of FIGS. 8A and 8B may be similar to the LED package 1 of FIGS. 1A and 1B, which is manufactured by performing the process operations of FIGS. 10A to 10J as described above. However, in FIG. 10I, a top surface of the transmissive material layer 13 may be adjusted to a higher level than the height 15H of the top surface of the preliminary support structure p15 so that the transmissive material layer 83 having the shape shown in FIGS. 8A and 8B may be formed. In this case, the transmissive material layer 83 may cover the top surface of the support structure 15, but the inventive concepts are not limited thereto.

FIGS. 11A to 11F are cross-sectional views of process operations of a method of manufacturing the LED package 2 shown in FIG. 2.

To begin, referring to FIGS. 9 and 10A to 10D, a preliminary light-emitting structure p11 may be formed on a growth substrate 10 (S101), and an electrode 17 may be formed on the preliminary light-emitting structure p11 (S103). The preliminary light-emitting structure p11 may be separated into units of discrete LEDs, thereby forming light-emitting structures 11 (S105).

Figure 11A:
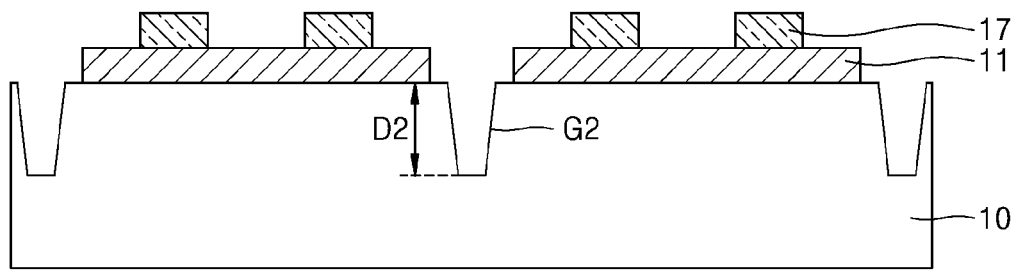
FIGS. 11A to 11F are cross-sectional views of process operations of a method of manufacturing the LED package shown in FIG. 2.
Figure 11B:
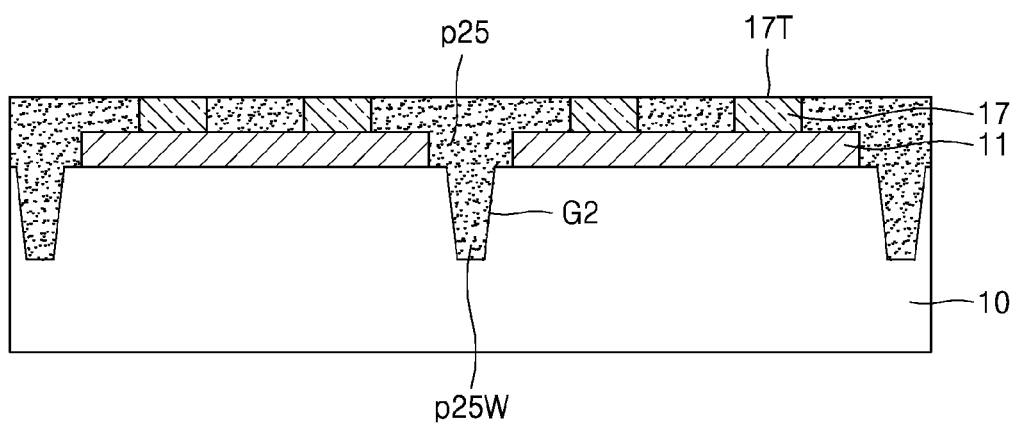

Thereafter, referring to FIGS. 9 and 11A, a first dicing process may be performed on an upper portion of the growth substrate 10 between adjacent light-emitting structures 11 so that a groove G2 may be formed in the growth substrate 10 (S107). In this case, the groove G2 may gradually narrow downward. Referring to FIGS. 9 and 11B, a preliminary support structure p25 may be formed to fill the groove G2 formed in the growth substrate 10 and cover a side surface of the light-emitting structure 11 and a side surface of the electrode 17 (S109). In this case, a preliminary sidewall unit p25W filling the groove G2 may gradually narrow downward along a shape of the groove G2.

Figure 11C:
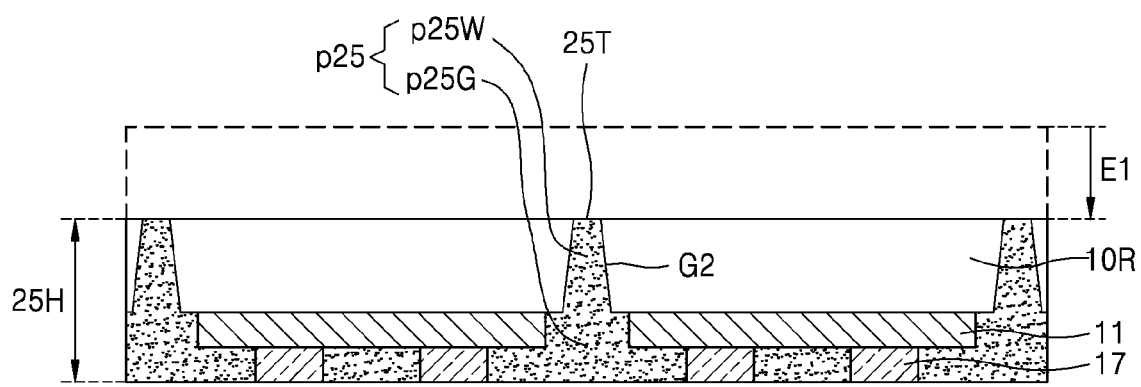
Figure 11D:
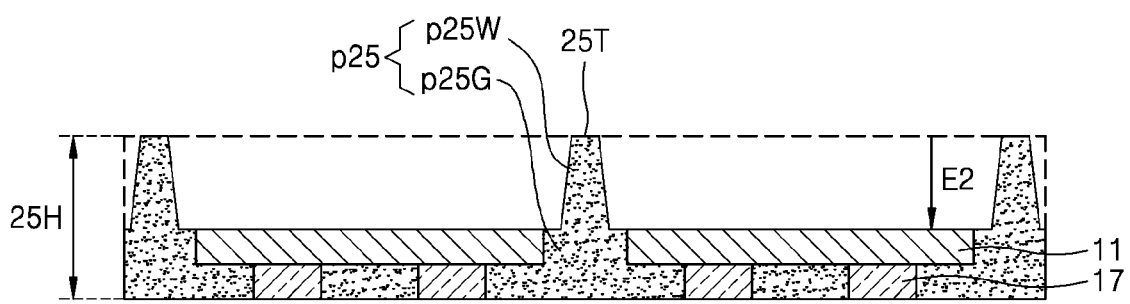

Referring to FIGS. 9, 11C, and 11D, the growth substrate 10 may be removed by overturning the resultant structure (S111). In this case, the growth substrate 10 may be removed (E1) by using a CMP process to a top surface 25T of the preliminary support structure p25. The remaining growth substrate 10R, which is located in a space defined by the preliminary sidewall unit p25W, may be removed (E2) by using an etching process. Due to the removal process, the preliminary sidewall unit p25W may have a closed barrier rib structure and expose a top surface of the light-emitting structure 11 and form a barrier rib between adjacent light-emitting structures 11. In this case, the preliminary sidewall unit p25W may narrow downward.

Figure 11E:
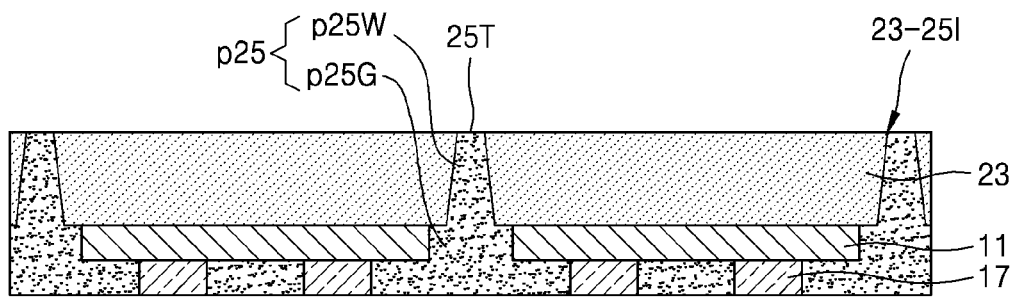

Referring to FIGS. 9 and 11E, a transmissive material layer 23 may be formed in a space defined by the preliminary support structure p25 and the light-emitting structure 11 (S113). Since the preliminary sidewall unit p25W narrows downward, there may be a sloped interface 23-25I between the preliminary sidewall unit p25W and the transmissive material layer 23.

Figure 11F:
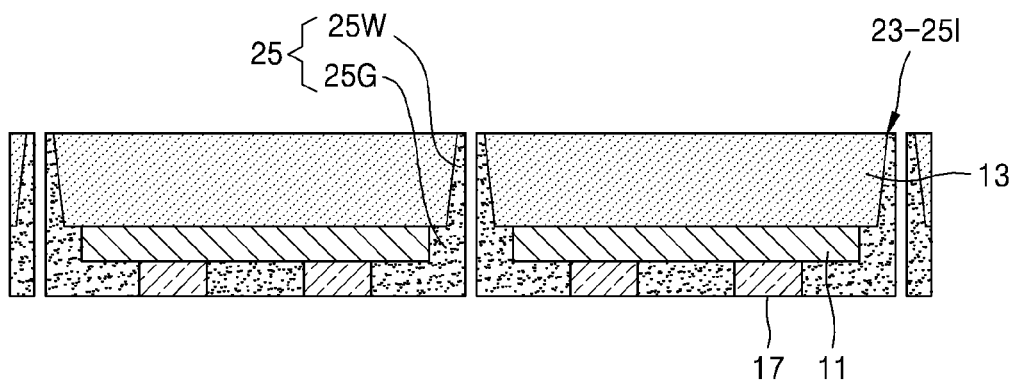

Referring to FIGS. 9 and 11F, a second dicing process may be performed along the top surface 25T of the sidewall unit p25W of the preliminary support structure p25, thereby forming discrete LED packages 2 shown in FIG. 2 (S115).

FIGS. 12A to 12G are cross-sectional views of process operations of a method of manufacturing the LED package 3 shown in FIG. 3.

Referring to FIGS. 9 and 10A to 10D, a preliminary light-emitting structure p11 may be formed on a growth substrate 10 (S101), and an electrode 17 may be formed on the preliminary light-emitting structure p11 (S103).

Figure 12A:
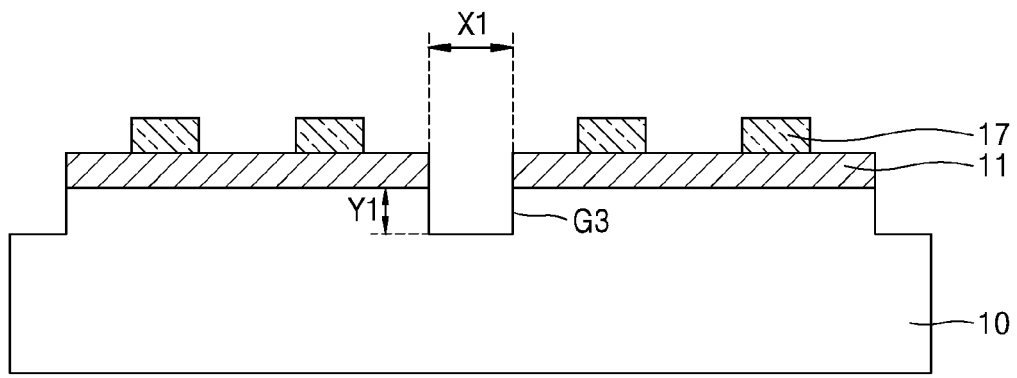
FIGS. 12A to 12G are cross-sectional views of process operations of a method of manufacturing the LED package shown in FIG. 3.

Thereafter, referring to FIGS. 9 and 12A, the preliminary light-emitting structure p11 may be separated into units of discrete LEDs, thereby forming light-emitting structures 11 (S105). The process of separating the preliminary light-emitting structure p11 may be performed by using an etching process to prevent or inhibit the occurrence of cracks in the preliminary light-emitting structure p11. During the process of etching the preliminary light-emitting structure p11, a top surface of the growth substrate 10 may be exposed. In this case, a portion of the exposed top surface of the growth substrate 10 may be etched together when the top surface of the growth substrate 10 is exposed. Thus, a first groove G3 may be formed in the growth substrate 10. The first groove G3 may be etched to a given (or alternatively, predetermined) depth Y1 from the top surface of the growth substrate 10. Also, the first groove G3 may be etched to have a width equal to the width W1 between adjacent light-emitting structures 11.

Figure 12B:
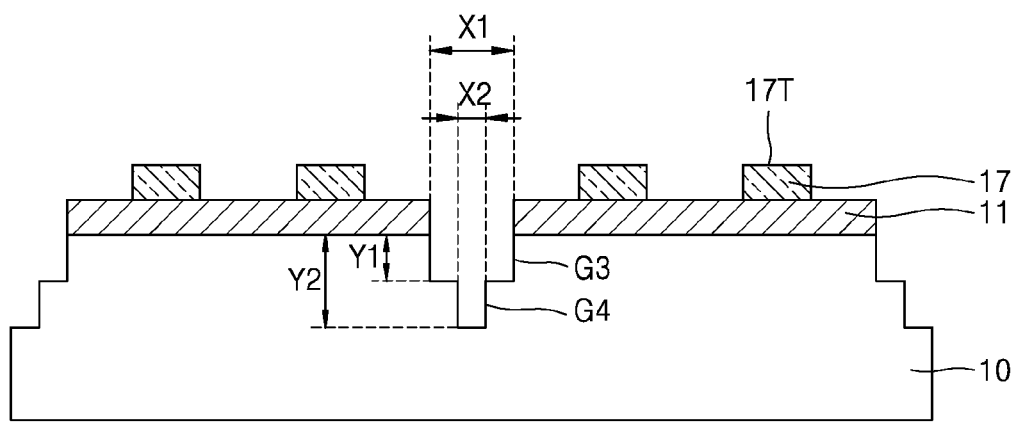

Referring to FIGS. 9 and 12B, a second groove G4 may be further formed in the first groove G3 (S107). That is, the second groove G4 may be formed such that a bottom surface of the second groove G4 is at a lower level than a bottom surface of the first groove G3. A depth Y2 of the second groove G4 from the top surface of the growth substrate 10 may be greater than the depth Y1 of the first groove G3. In this case, the depth Y2 of the second groove G4 may be adjusted to be less than the thickness of the growth substrate 10. The second groove G4 may be formed by using a sawing blade wheel, a laser, or an etching process.

Figure 12C:
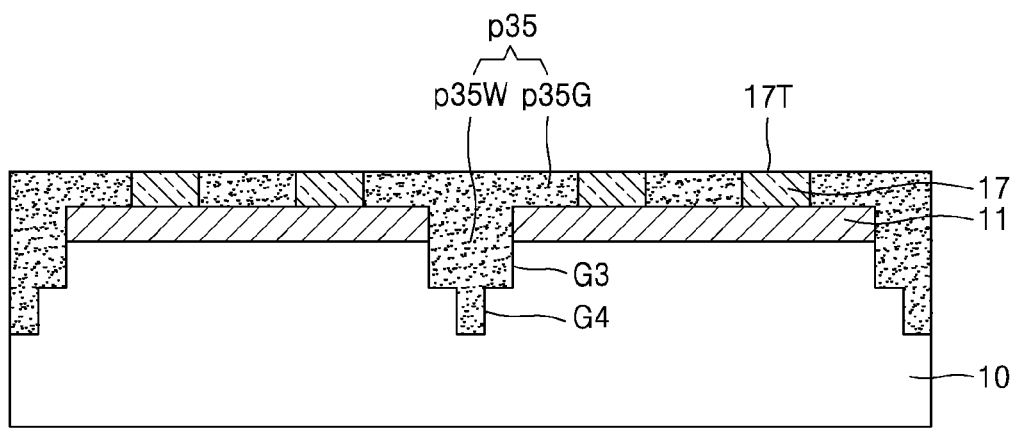

Thereafter, referring to FIGS. 9 and 12C, a preliminary support structure p35 may be formed to fill the first and second grooves G3 and G4 formed in the growth substrate 10 and cover a side surface of the light-emitting structure 11 and a side surface of the electrode 17 (S109). In this case, a preliminary sidewall unit p35W filling the first and second grooves G3 and G4 may have a stepped shape along shapes of the first and second grooves G3 and G4.

Figure 12D:
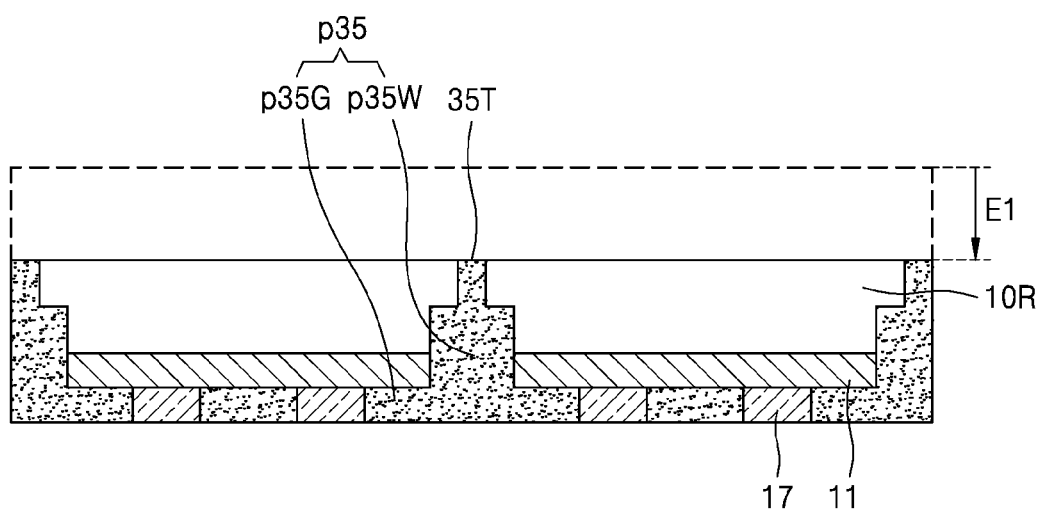
Figure 12E:
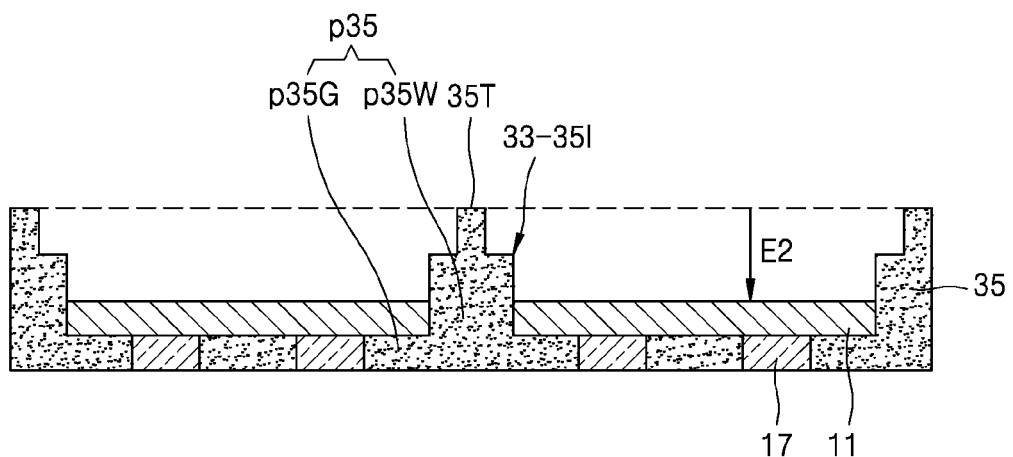
Figure 12F:
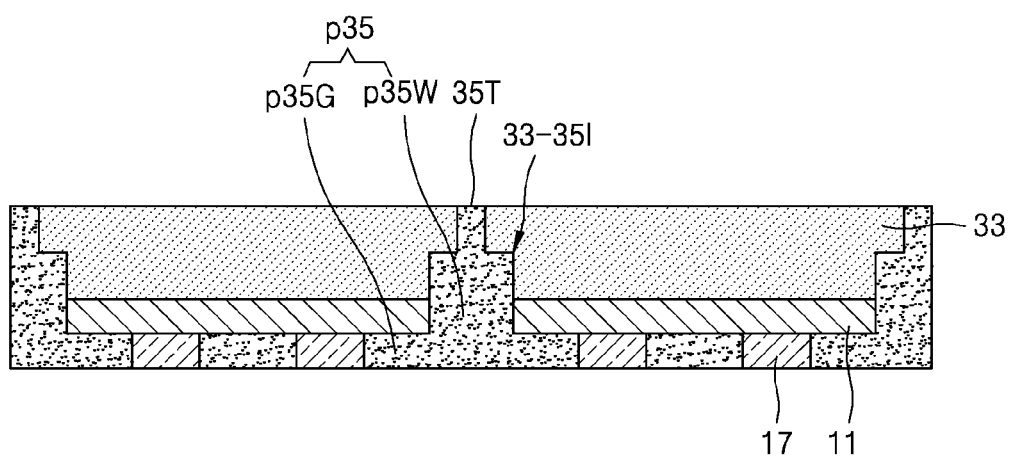

Referring to FIGS. 9, 12D, and 12E, the growth substrate 10 may be removed by overturning the resultant structure (S111). Referring to FIGS. 9 and 12F, a transmissive material layer 33 may be formed in a space defined by the preliminary support structure p35 and the light-emitting structure 11 (S113). In this case, a stepped interface 33-35I may be formed between the preliminary sidewall unit p35W and the transmissive material layer 33 along the stepped shape of the preliminary sidewall unit p35W.

Figure 12G:
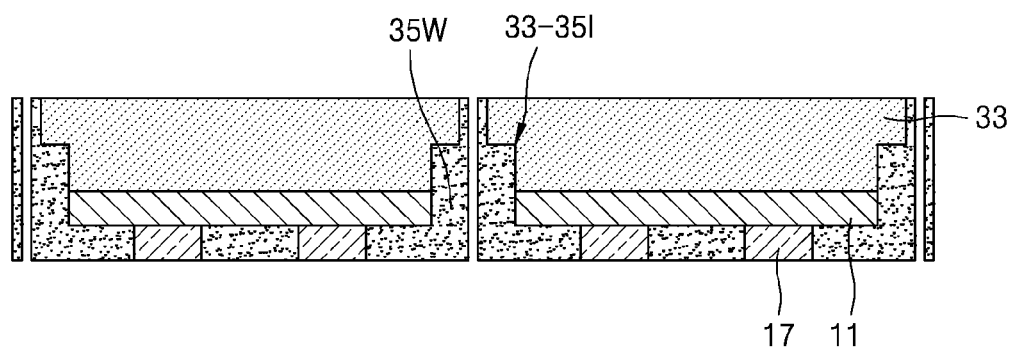

Thereafter, referring to FIGS. 9 and 12G, a second dicing process may be performed along a top surface 35T of the sidewall unit p35W of the preliminary support structure p35, thereby forming the discrete LED package 3 shown in FIG. 3 (S115).

FIGS. 13A to 13D are cross-sectional views of process operations of a method of manufacturing the LED package 5 shown in FIG. 5.

Referring to FIGS. 9 and 10A to 10D, a preliminary light-emitting structure p11 may be formed on a growth substrate 10 (S101), and an electrode 17 may be formed on the preliminary light-emitting structure p11 (S103). The preliminary light-emitting structure p11 may be separated into discrete LEDs, thereby forming light-emitting structures 11 (S105). A first dicing process may be performed on an upper portion of the growth substrate 10 between adjacent light-emitting structures 11 so that a groove G1 may be formed in the growth substrate 10 (S107).

Figure 13A:
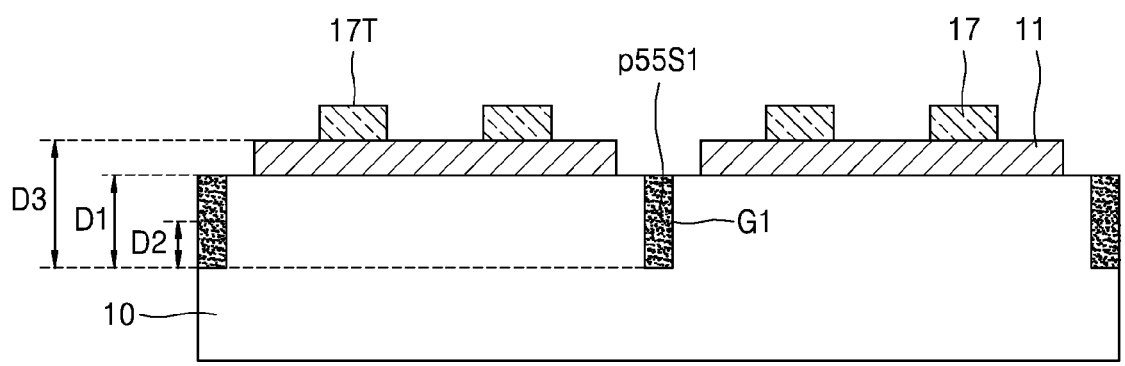
FIGS. 13A to 13D are cross-sectional views of process operations of a method of manufacturing the LED package shown in FIG. 5.
Figure 13B:
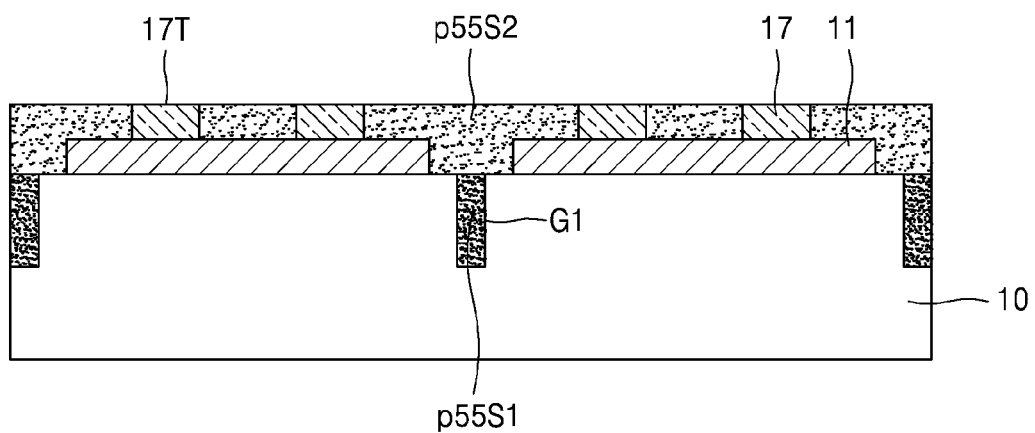

Thereafter, referring to FIGS. 9 and 13A, preliminary support structures p55S1 and p55S2 may be formed to fill the groove G1 formed in the growth substrate 10 and cover a sidewall of the light-emitting structure 11 and a side surface of the electrode 17 (S109). In this case, at least a portion of the groove G1 formed in the growth substrate 10 may be filled with a first material to form a first preliminary support structure p55S1. Thereafter, referring to FIGS. 9 and 13B, a second preliminary support structure p55S2 may be formed on the first preliminary support structure p55S1 such that a top surface of the second preliminary support structure p55S2 is at the same level as a top surface of the electrode 17. FIG. 13A illustrates a case in which the first material is formed to a first height D1 to fill only the groove G1, but the inventive concepts are not limited thereto. The first preliminary support structure p55S1 including the first material may fill a portion of the groove HI and have a second height D2 lower than the first height D1. Also, the first preliminary support structure p55S may cover at least a portion of a side surface of the light-emitting structure 11 and have a third height D3 that is greater than the first height D1.

Figure 13C:
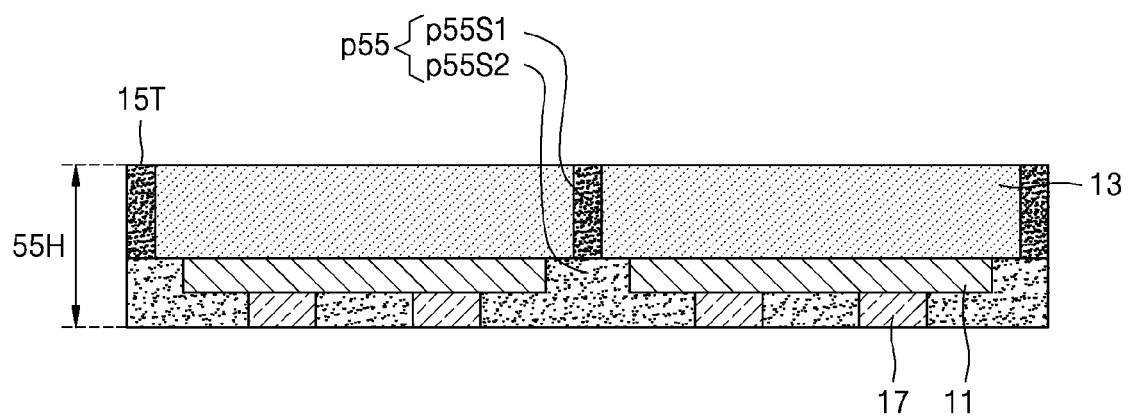

Referring to FIGS. 9 and 13C, the growth substrate 10 may be removed by overturning the resultant structure (S111). A transmissive material layer 13 may be formed in a space defined by the preliminary support structure p55 and the light-emitting structure 11 (S113). The transmissive material layer 13 may be formed in the preliminary support structure p15 having a closed barrier rib structure by using a single dispensing process. Accordingly, even if a plurality of LED packages 5 are collectively manufactured on a wafer level, each of transmissive material layers 13 may be uniformly formed to embody desired color coordinates.

Figure 13D:
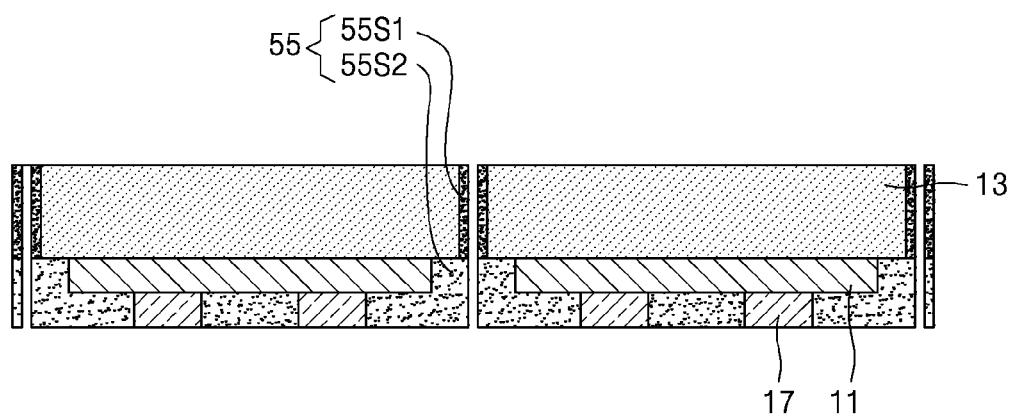

Thereafter, referring to FIGS. 9 and 13D, a second dicing process may be performed on the preliminary support structure p55, thereby forming the discrete LED package 5 shown in FIG. 5 (S115).

Figure 14:
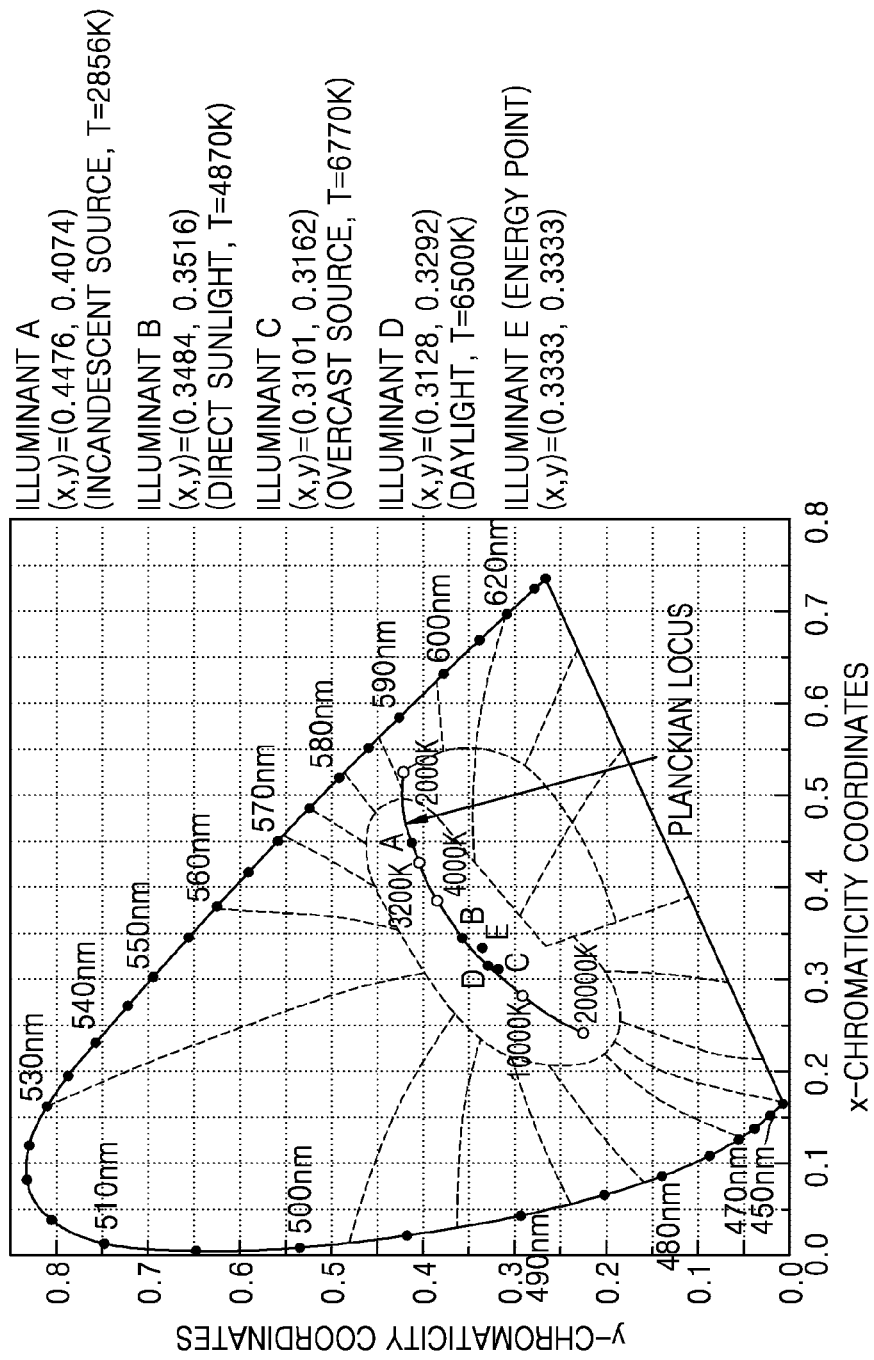
FIG. 14 is a graph of a Planckian spectrum.

FIG. 14 is a graph of a Planckian spectrum. Each of the LED packages 1 to 8 described with reference to FIGS. 1 to 13D may emit blue light, green light, red light, or UV light according to the kind of a compound semiconductor constituting the LED packages 1 to 8.

A color rendering index (CRI) of the LED packages 1 to 8 may be controlled to be within the range of 40 to 100. Also, the LED packages 1 to 8 may emit various types of white light having a color temperature range from 2000K to 20000K. When necessary, the LED packages 1 to 8 may generate visible light (e.g., purple light, blue light, green light, red light, and orange light) or infrared (IR) light and adjust color of illumination light. Also, the LED packages 1 to 8 may generate light having a special wavelength to stimulate plant growth.

Referring to FIG. 14, white light generated by a combination of a blue LED with yellow, green, red phosphor and/or green and red LEDs may have at least two peak wavelengths. Coordinates (x, y) of the white light in a CIE 1931 coordinate system may be located on a segment connecting (0.4476, 0.4074), (0.3484, 0.3516), (0.3101, 0.3162), (0.3128, 0.3292), and (0.3333, 0.3333) or located in a region surrounded with the segment and a blackbody radiator spectrum. In FIG. 14, since the white light around point E (0.3333, 0.3333) disposed under the black-body radiator spectrum is relatively weak in the light of the yellow-based component, it may be used as an illumination light source in a region in which a user may have a more vivid or fresh feeling than naked eyes. Therefore, an illumination product using the white light around point E (0.3333, 0.3333) disposed under the black-body radiator spectrum may be suitable as lighting for shopping malls that sell groceries and clothes.

In some embodiments, the transmissive material layers 13, 23, 33, 43, 53, 63, 73, and 83 of the LED packages 1 to 8 may include phosphors, which may have empirical formulas and colors as follows.

Oxide-based: yellow color and green color (Y, Lu, Se, La, Gd, Sm)$_3$(Ga, Al)$_5$O$_{12}$:Ce, blue color BaMgA$_{10}$O$_{17}$:Eu, 3Sr$_3$(PO$_4$)$_2$.CaCl:Eu Silicate-based: yellow color and green color (Ba, Sr)$_2$SiO$_4$:Eu, yellow color and orange color (Ba, Sr)$_3$SiO$_5$:Eu Nitride-based: green color β-SiAlON:Eu, yellow color (La, Gd, Lu, Y, Sc)$_3$Si$_6$N$_{11}$:Ce, orange color α-SiAlON:Eu, red color (Sr, Ca)AlSiN$_3$:Eu, (Sr, Ca)AlSi ON$_3$:Eu, (Sr, Ca)$_2$Si$_5$N$_8$:Eu, (Sr, Ca)$_2$Si$_5$(ON)$_8$:Eu, (Sr, Ba)SiAl$_4$N$_7$:Eu Sulfide-based: red color (Sr, Ca)S:Eu, (Y, Gd)$_2$O$_2$S:Eu, green color SrGa2S4:Eu Fluoride-based: KSF-based red color K$_2$SiF$_6$:Mn$^{4+}$, K$_3$SiF$_7$:Mn$^{4+}$ Compositions of the phosphors should be based on stoichiometry, and respective elements may be replaced by other elements in respective groups in the periodic table. For example, Sr may be replaced by Group II elements (alkaline earth metals), such as Ba, Ca, or Mg, and Y may be replaced by a lanthanum-based element, such as Tb, Lu, Sc, or Gd. Also, europium (Eu) serving as an activator may be replaced by cerium (Ce), terbium (Tb), praseodymium (Pr), erbium (Er), or ytterbium (Yb) according to a desired energy level. An activator may be used alone or a co-activator may be further applied to vary characteristics. Furthermore, materials, such as QDs, may be used as materials capable of replacing the phosphors, and the phosphors and the QD may be used alone or in combination with one another for LEDs. A QD may have a structure including a core (about 3 nm to about 10 nm), such as CdSe or InP, a shell (about 0.5 nm to about 2 nm), such as ZnS and ZnSe, and a ligand for stabilizing the core and the shell, and may be embodied in various colors according to size.

A method of coating phosphors or QDs may include at least one of a process of spraying the phosphors or QDs onto a light-emitting structure, a process of covering the light-emitting structure with a film, or a process of attaching a film or a ceramic phosphor sheet to the light-emitting structure.

The spraying process may typically include a dispensing process and a spray coating process, and the dispensing process may include a pneumatic process and a mechanical process, such as a screw fastening process or a linear-type fastening process. In a jetting process, an amount of dots may be adjusted by jetting a very small amount of phosphor or QDs, and color coordinates may be controlled by adjusting the amount of dots.

The process of covering the light-emitting structure with the film may include an electrophoresis process, a screen printing process, or a phosphor molding process, which may be selectively adopted depending on whether or not side surfaces of a chip need to be coated with the film.

At least two phosphor layers having different emission wavelengths may be separated to control efficiency of a long-wavelength light-emitting phosphor configured to re-absorb light emitted in a short wavelength range, from among at least two phosphors having different emission wavelengths. Also, a DBR (or an omni-directional reflector (ODR)) layer may be provided between the respective phosphor layers in order to minimize re-absorption of light and interference between an LED chip and the at least two phosphor layers.

To form a uniform coated layer, phosphor may be formed as a film or ceramic type and then attached onto a light-emitting structure.

A light conversion material may be disposed in a remote manner to vary optical efficiency or light distribution characteristics. In this case, the light conversion material may be disposed along with a transparent polymer or glass according to endurance and heat resistance thereof.

Since a technique of coating phosphor greatly affects optical properties of an LED, techniques of controlling thicknesses of phosphor coating layers or uniformly dispersing phosphors have variously been studied. QDs may be disposed on a light-emitting structure in the same manner as phosphors. Also, the QDs may be interposed between glass and a transparent polymer material and perform a light conversion operation.

A transmissive material may be disposed as a filler on a light-emitting structure to protect the light-emitting structure from the outside or improve light extraction efficiency. The transmissive material may be a transparent organic material, such as an epoxy, silicone, a hybrid of an epoxy and silicone, and may be cured by heating or irradiation with light, or by allowing for the transmissive material to set over a given (or alternatively, predetermined) period of time. Polydimethylsiloxane (PDMS) may be categorized as methyl-based silicone, while poly methyl phenyl siloxane may be categorized as a phenyl-based silicone. The methyl-based silicone may differ from the phenyl-based silicone in terms of refractive index, moisture permeability, light transmittance, light-resistant stability, and heat-resistant stability. Also, the silicone may be cured at a different rate according to a crosslinking agent and a catalyst and affect dispersion of phosphor.

Light extraction efficiency may depend on a refractive index of the filler. At least two silicones having different refractive indices may be sequentially stacked to minimize a difference in refractive indices between a medium disposed at an outermost portion of a chip from which blue light is emitted and a medium from which light emitted into the air. In general, the methyl-based silicone may have the highest heat-resistant stability, and the phenyl-based silicone, the hybrid, and the epoxy may vary at a low rate with a rise in temperature in an orderly fashion. Silicones may be classified into a gel type, an elastomer type, and a resin type according to hardness.

The light-emitting structure may further include a lens to radially guide light irradiated by a light source. In this case, a previously shaped lens may be attached onto the light-emitting structure. Alternatively, a flowable organic solvent may be injected into a mold on which the light-emitting structure is mounted, and solidified to form the lens. The lens may be directly attached to the filler formed on the chip or spaced apart from the filler by adhering an outer portion of the LED to an outer portion of the lens. When the flowable organic solvent is injected into the mold, an injection molding process, a transfer molding process, or a compression molding process may be used. Light distribution characteristics may be affected by a shape of the lens (e.g., a concave shape, a convex shape, a rough shape, a conic shape, or a geometric structure). The shape of the lens may be modified to meet the needs for efficiency and light distribution characteristics.

Figure 15A:
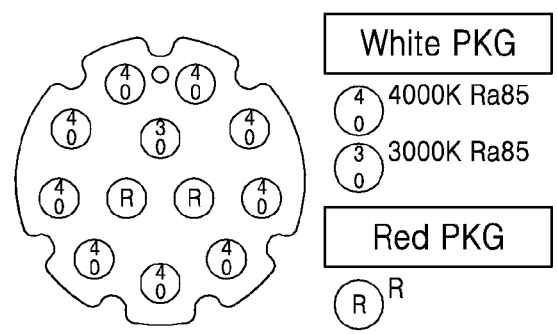
FIGS. 15A and 15B are diagrams of white light-emitting package modules including LED packages manufactured according to example embodiments.
Figure 15B:
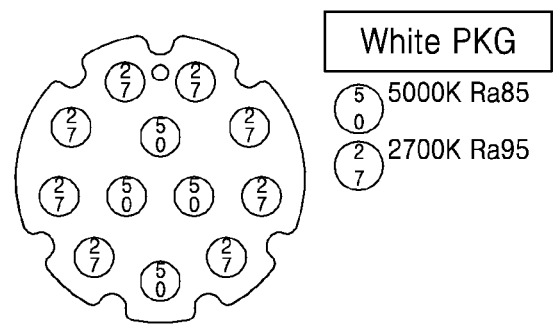

FIG. 15 are diagrams of white light-emitting package modules including LED packages manufactured according to example embodiments.

Referring to (a) of FIG. 15, a white light-emitting package module may be manufactured by combining white LED packages having a color temperature of about 4,000 K and about 3,000 K with a red LED package. The white light-emitting package module may adjust a color temperature in the range of about 3,000 K to about 4,000 K and provide white light having a CRI Ra of about 85 to about 99.

Referring to (b) of FIG. 15, a white light-emitting package module may be manufactured by combining a white LED package having a color temperature of about 2,700 K with a white LED package having a color temperature of about 5,000 K. The white light-emitting package module may adjust a color temperature in the range of about 2,700 K to about 5,000 K and provide white light having a CRI Ra of about 85 to about 99. The number of LED packages for each color temperature may be changed according to a basic color temperature setting value. For example, in a lighting apparatus, of which a basic color temperature setting value is around a color temperature of about 4,000 K, the number of packages corresponding to a color temperature of about 4,000 K may be larger than the number of packages corresponding to a color temperature of about 3,000 K or the number of red LED packages.

The phosphor may have the following empirical formulas and colors.

Oxide-based: yellow and green color $Y_3Al_5O_{12}$:Ce, $Tb_3Al_5O_{12}$:Ce, $Lu_3Al_5O_{12}$:Ce Silicate-based: yellow color and green color $(Ba,Sr)_2SiO_4$:Eu, yellow color and orange color $(Ba,Sr)_3SiO_5$:Ce Nitride-based: green color $\beta$-SiAlON:Eu, yellow color $La_3Si_6O_{11}$:Ce, orange color $\alpha$-SiAlON:Eu, red color $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_3+x+yN_{18-x-y}$ ($0.5 \leq x \leq 3$, $0 < z < 0.3$, $0 < y \leq 4$) Formula (1)

In Formula (1), Ln may be at least one element selected from the group consisting of Group IIIa elements and rare-earth elements, and M may be at least one element selected from the group consisting of calcium (Ca), barium (Ba), strontium (Sr), and magnesium (Mg).

Fluoride-based: KSF-based red color $K_2SiF_6$:Mn$^{4+}$, $K_2TiF_6$:Mn$^{4+}$, $NaYF_4$:Mn$^{4+}$, $NaGdF_4$:Mn$^{4+}$ (for example, a combination ratio of Mn may be $0 < z <= 0.17$).

The composition of the phosphor needs to basically conform with stoichiometry, and the respective elements may be substituted by other elements included in the respective groups of the periodic table. For example, strontium (Sr) may be substituted by at least one selected from the group consisting of barium (Ba), calcium (Ca), and magnesium (Mg) of alkaline-earth group II, and Y may be substituted by at least one selected from the group terbium (Tb), lutetium (Lu), scandium (Sc), and gadolinium (Gd). In addition, europium (Eu), which is an activator, may be substituted by at least one selected from the group consisting of cerium (Ce), terbium (Tb), praseodymium (Pr), erbium (Er), and ytterbium (Yb) according to a desired energy level. The activator may be applied solely or a sub-activator may be additionally applied for characteristic modification. Also, materials, such as QDs, may be used as materials capable of replacing the phosphors, and the phosphors and the QD may be used alone or in combination with one another.

A QD may have a structure including a core (about 3 nm to about 10 nm), such as CdSe or InP, a shell (about 0.5 nm to about 2 nm), such as ZnS and ZnSe, and a ligand for stabilizing the core and the shell, and may be embodied in various colors according to size.

A wavelength conversion material may be implemented as being contained in an encapsulating material. However, the wavelength conversion material may be previously prepared in a film shape and be attached to a surface of an LED chip. In this case, the wavelength conversion material may be coated on the top surface of the LED chip to a uniform thickness.

FIG. 16 shows types of phosphors according to applications included a white LED package using a blue LED chip (about 440 nm to about 460 nm).

Figure 17:
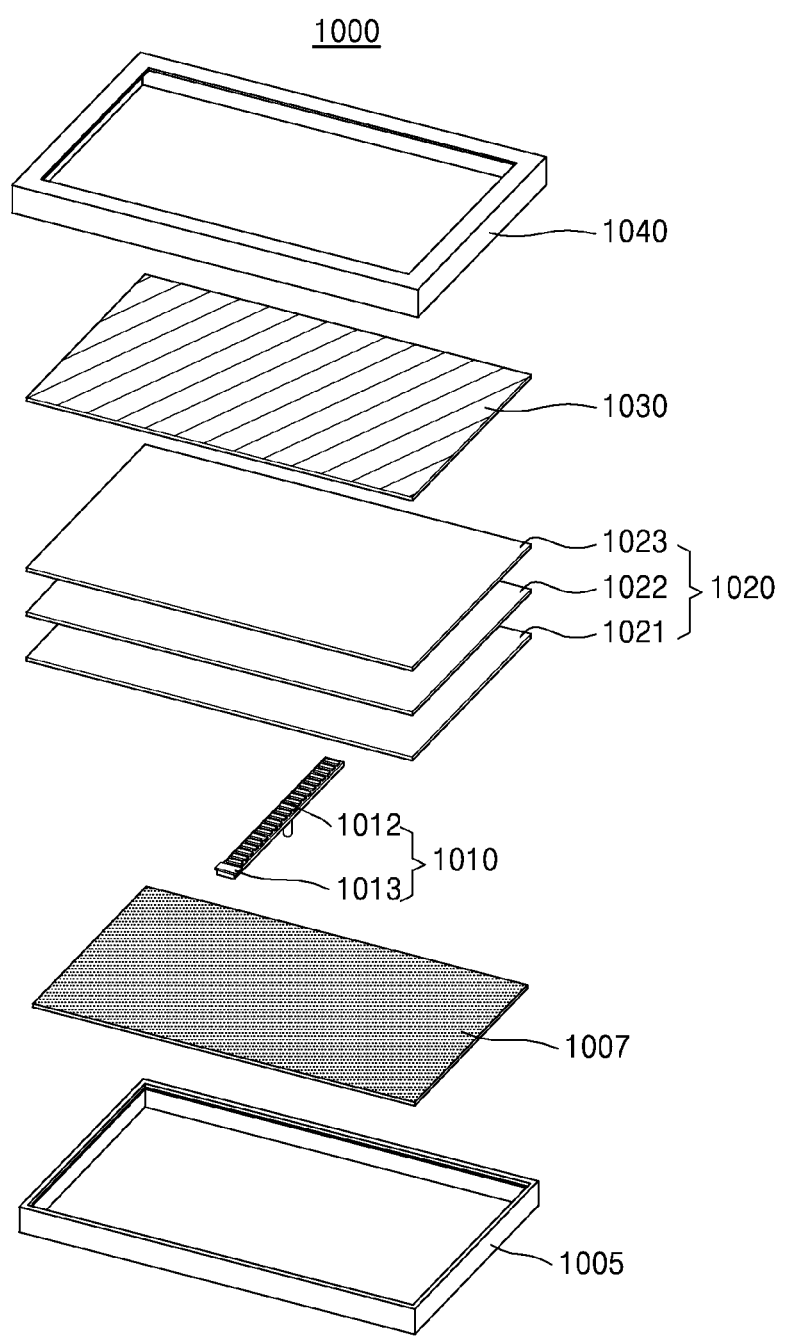
FIG. 17 is an exploded perspective view of a backlight (BL) assembly including an LED package according to an example embodiment.

FIG. 17 is an exploded perspective view of a backlight (BL) assembly 1000 including an LED package according to an example embodiment.

Referring to FIG. 17, a direct-light-type BL assembly 1000 may include a lower cover 1005, a reflection sheet 1007, a light-emitting module 1010, an optical sheet 1020, an LC panel 1030, and an upper cover 1040.

The light-emitting module 1010 may include an LED array 1012 including at least one LED and a circuit substrate and/or a controller (e.g., a rank storage unit and a driver IC) 1013. The light-emitting module 1010 may include at least one of the LED packages 1 to 8 described with reference to FIGS. 1 to 13D.

The controller 1013 may store and control driving information of each LED included in the LED array 1012 and/or a driving program IC capable of controlling turning-on/off or brightness) of the LEDs separately or in groups. The LED array 1012 may receive emission power and driving information from an LED driver disposed outside the direct-light-type BL assembly 1000. The controller 1013 may sense the driving information from the LED driver and control current supplied to each of the LEDs of the LED array 1012 based on the sensed driving information.

The optical sheet 1020 may be provided on the light-emitting module 1010 and include a diffuser sheet 1021, a condensing sheet 1022, and a protection sheet 1023. That is, the diffuser sheet 1021 configured to diffuse light emitted by the light-emitting module 1010, the condensing sheet 1022 configured to condense the light diffused by the diffuser sheet 1021 and increase luminance, and the protection sheet 1023 configured to protect the condensing sheet 1012 and ensure a view angle may be sequentially prepared on the light-emitting module 1010. The upper cover 1040 may enclose an edge of the optical sheet 1020 and be assembled with the lower cover 1005. The LC panel 1030 may be further provided between the optical sheet 1020 and the upper cover 1040.

The LC panel 1030 may include a pair of a first substrate (not shown) and a second substrate (not shown), which may be bonded to each other with an LC layer therebetween. A plurality of gate lines may intersect a plurality of data lines to define pixel regions on the first substrate. Thin-film transistors (TFTs) may be respectively provided at intersections between the pixel regions, and may correspond one-to-one to and be connected to pixel electrodes mounted on the respective pixel regions. The second substrate may include red (R), green (G), and blue (B) color filters respectively corresponding to the pixel regions and a black matrix covering edges of the respective color filters, the gate lines, the data lines, and the TFTs.

Figure 18:
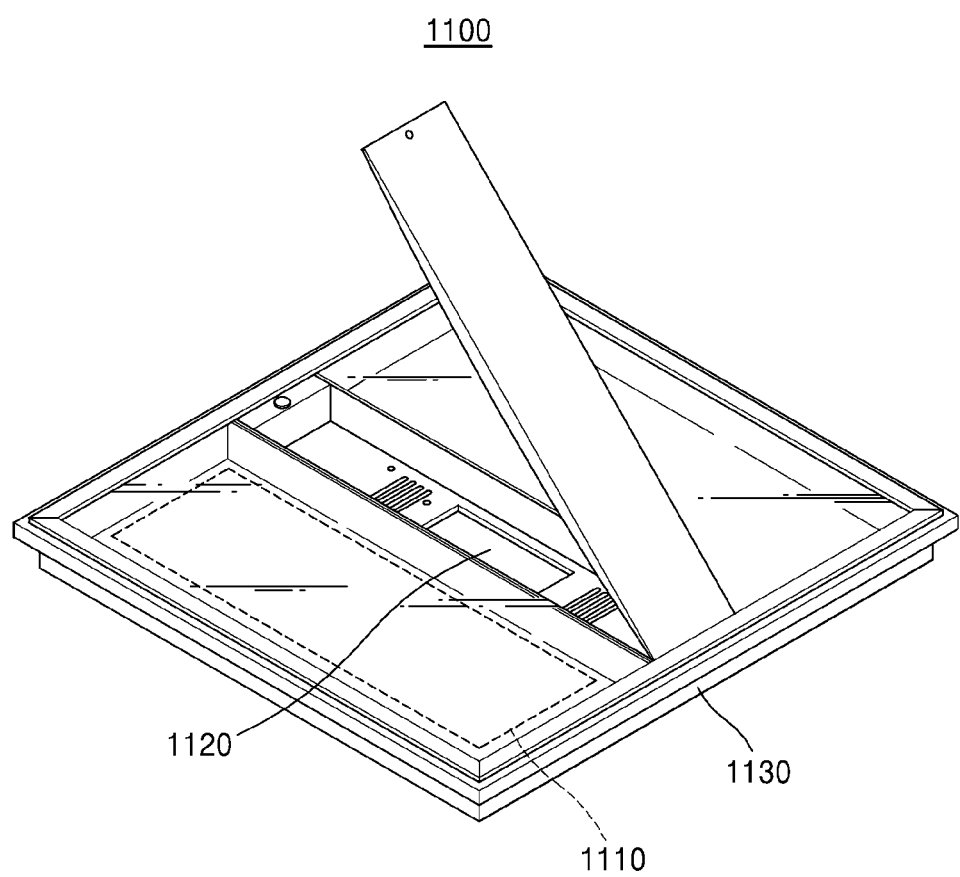
FIG. 18 is a schematic diagram of a flat-panel semiconductor light-emitting apparatus including an LED array unit and an LED module in which an LED package according to an example embodiment is arranged.

FIG. 18 is a schematic diagram of a flat-panel semiconductor light-emitting apparatus 1100 including an LED array unit and an LED module in which an LED package according to an example embodiment is arranged.

Referring to FIG. 18, the flat-panel semiconductor light-emitting apparatus 1100 may include a light source 1110, a power supply device 1120, and a housing 1130. The light source 1110 may include an LED array unit including at least one of the LED packages 1 to 8 according to example embodiments.

The light source 1110 may include an LED array unit and have an overall plane shape.

The power supply device 1120 may be configured to supply power to the light source 1110.

The housing 1130 may include a containing space in which the light source 1110 and the power supply device 1120 are contained, and have a hexahedral shape having one open side surface, but the inventive concepts are not limited thereto. The light source 1110 may be disposed to emit light toward the open side surface of the housing 1130.

Figure 19:
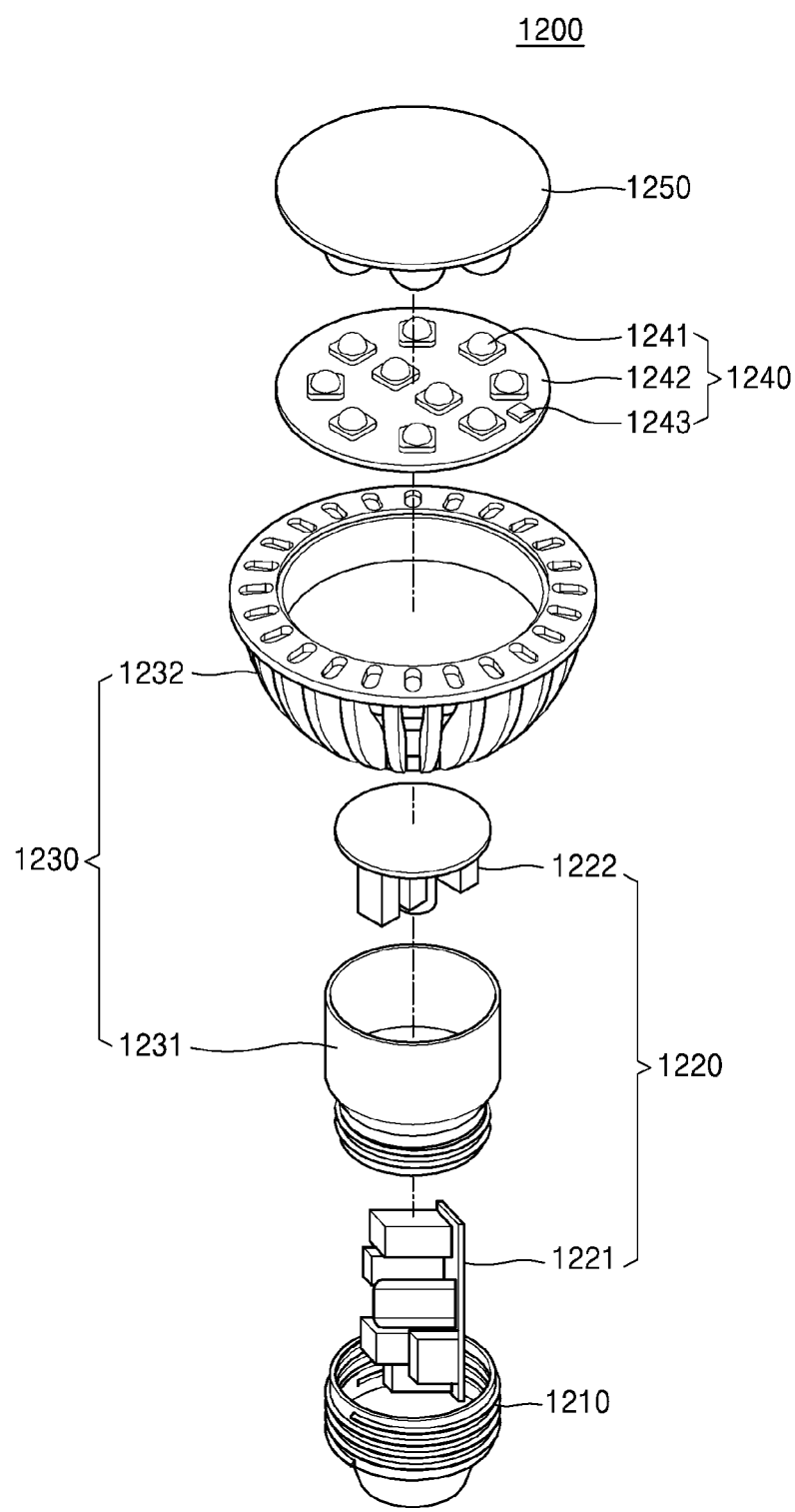
FIG. 19 is a schematic diagram of a bulb-type lamp, which is a semiconductor light-emitting apparatus including an LED array unit and an LED module in which an LED package according to an example embodiment is arranged.

FIG. 19 is a schematic diagram of a bulb-type lamp, which is a semiconductor light-emitting apparatus 1200 including an LED array unit and an LED module in which an LED package according to an example embodiment is arranged.

Referring to FIG. 19, the semiconductor light-emitting apparatus 1200 may include a socket 1210, a power source unit 1220, a heat radiation unit 1230, a light source 1240, and an optical unit 1250. According to an example embodiment, the light source 1240 may include an LED array unit including at least one of the LED packages 1 to 8 according to example embodiments.

The socket 1210 may be configured to be capable of being replaced by an illumination system of the related art. Power supplied to the illumination system 1200 may be applied through the socket 1210. The power source unit 1220 may be formed by assembling a first power source unit 1221 and a second power source unit 1222.

The heat radiation unit 1230 may include an internal radiation unit 1231 and an external radiation unit 1232. The internal radiation unit 1131 may be directly connected to the light source 1240 and/or the power source unit 1220 so that heat may be transmitted to the external radiation unit 1232. The optical unit 1250 may include an internal optical unit (not shown) and an external optical unit (not shown) and may be configured to uniformly disperse light emitted by the light source 1240.

The light source 1240 may receive power from the power source unit 1220 and emit light to the optical unit 1250. The light source 1240 may include an LED array unit including an LED according to one of the example embodiments. The light source 1240 may include at least one LED package 1241, a circuit substrate 1242, and a rank storage unit 1243, and the rank storage unit 1243 may store rank information of LED packages 1241.

A plurality of LED packages 1241 included in the light source 1240 may be of the same kind to generate light having the same wavelength. Alternatively, the plurality of LED packages 1241 included in the light source 1240 may be of different kinds to generate light having different wavelengths.

For example, the LED package 1241 may include a blue LED, a white LED manufactured by combining yellow, green, red, or orange phosphors, and at least one of violet, blue, green, red, or infrared (IR) LEDs so as to control a color temperature of white light and a CRI. Alternatively, when an LED chip emits blue light, an LED package including at least one of yellow, green, and red phosphors may be configured to emit white light having various color temperatures according to a combination ratio of the phosphors. Alternatively, an LED package in which a green or red phosphor is applied to the blue LED chip may be configured to emit green or red light. The LED package configured to emit white light may be combined with the LED package configured to emit green or red light so as to control a color temperature of white light and CRI. Also, the LED package 1241 may include at least one of LEDs configured to emit violet, blue, green, red, or IR light.

Figure 20:
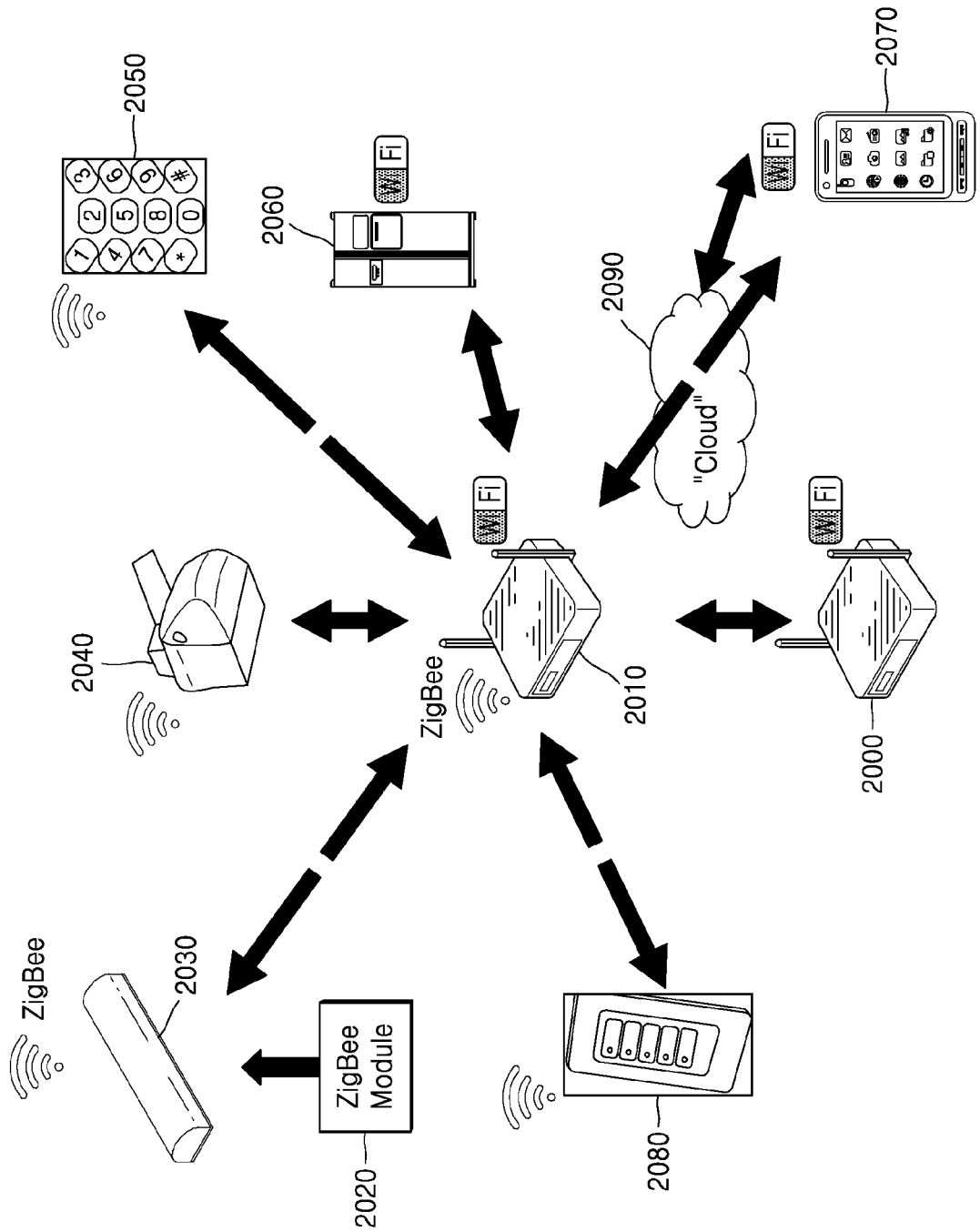
FIGS. 20 and 21 are diagrams of examples of applying an illumination system using an LED package according to an example embodiment or an electronic device to a home network.
Figure 21:
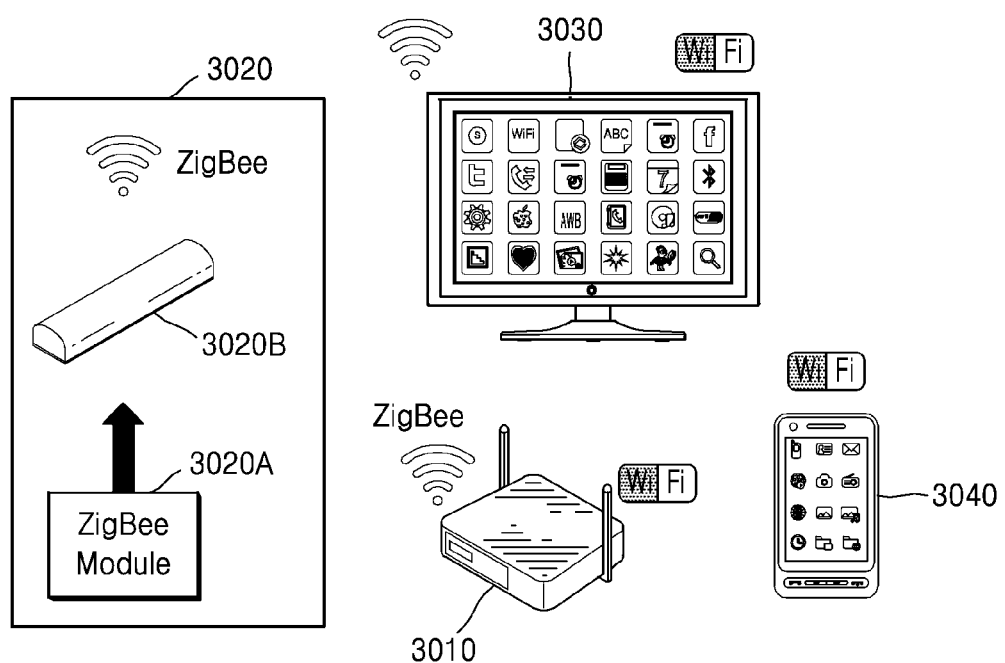

FIGS. 20 and 21 are diagrams of examples of applying an illumination system using an LED package according to an example embodiment or an electronic device to a home network.

Referring to FIGS. 20 and 21, the home network may include a home wireless router 2000, a gateway hub 2010, a ZigBee module 2020, an LED lamp 2030, a garage door lock 2040, a wireless door lock 2050, a home application 2060, a cell phone 2070, a wall-mounted switch 2080, and a cloud network 2090.

The home network may automatically control the turn-on/off, color temperature, CRI, and/or brightness of the LED lamp 2030 using household wireless communications (e.g., ZigBee and WiFi) depending on operation states of a bedroom, a living room, a front door, a storage closet, and household appliances and ambient environments and statuses. For example, as shown in FIG. 21, the brightness, color temperature, and/or CRI of a lighting apparatus 3020B may be automatically controlled using a gateway 3010 and a ZigBee module 3020A depending on the type of a TV program viewed on a TV 3030 or the brightness of a screen of the TV 3030. When a program value of a TV program is a human drama, the lighting apparatus 3020B may lower a color temperature to 12,000K or less (e.g., 5,000K) and adjust a color sense according to a preset value, thus creating a cozy atmosphere. On the other hand, when a program value is a gag program, the home network may be configured such that the lighting apparatus 3020B may increase a color temperature to 5,000K or more according to a set value so as to be adjusted to bluish white light.

Furthermore, not only the on/off operations, brightness, color temperature, and/or CRI of the lighting apparatus 3020B but also electronic appliances, such as TVs, refrigerators, and air conditioners, which are connected to the lighting apparatus 3020B, may be controlled using a household wireless protocol (e.g., ZigBee, WiFi, or LiFi) through a smartphone or a computer. Here, the LiFi communication refers to a short-distance wireless communication protocol using visible light of a lighting apparatus. For example, an indoor lighting apparatus or electronic appliances may be controlled through a smartphone by using a method including realizing a lighting control application program of the smartphone, which indicates the color coordinate system shown in FIG. 14 and mapping a sensor connected to all lighting apparatuses installed at home in accordance with the color coordinate system by using a communication protocol (e.g., ZigBee, WiFi, LiFi, etc.), namely, indicating a position of an indoor lighting apparatus, a current setting value, and an on/off state value, changing a state value by selecting a lighting apparatus located in a specific position, and varying a state of the lighting apparatus according to the changed value.

The ZigBee module 2020 or 3020A may be unified with an optical sensor to form a module, or be unified with a light-emitting apparatus.

The visible light wireless communication (LiFi) technology is a wireless communication technology that wirelessly transmits information by using light of a visible light wavelength the human may recognize with his/her eyes. The visible light wireless communication technology differs from the existing wired optical communication technology and infrared wireless communication in that the light of the visible light wavelength is used, and differs from the wired optical communication technology in that communication environment is a wireless environment. Contrary to the RF wireless communication technology, the visible light wireless communication technology may freely be used without regulation or permission in terms of frequency use. In addition, the visible light wireless communication technology has desirable physical security and has differentiation that enables a user to confirm a communication link with his/her eyes. Furthermore, the visible light wireless communication technology is a convergence technology that is capable of simultaneously obtaining the unique purpose of the light source and the communication function. In addition, an LED lighting apparatus may be used for an internal light source or an external light source for vehicles. The LED lighting apparatus may be used for an internal light source, such as an interior light, a reading light, or various lights for a gauge board for vehicles. Also, the LED lighting apparatus may be used for an external light source, such as a headlight, a brake light, a direction guide light, a fog light, a running light for vehicles.

An LED using a particular wavelength range may promote growth of plants, stabilize human feelings, or cure diseases. The LED may be used as a light source for robots or various mechanical apparatuses. Since the LED has low power consumption and a long lifetime, illumination systems may be embodied by combining the LED with an eco-friendly renewable energy power system using solar cells or wind power.

While the inventive concepts have been particularly shown and described with reference to example embodiments thereof, it will be understood that various changes in form and details may be made therein without departing from the spirit and scope of the following claims.

What is claimed is:

1. A light-emitting diode (LED) package comprising:
   a light-emitting structure including a first conductivity type layer, a second conductivity type layer, and an active layer between the first and second conductivity type layers;
   a transmissive material layer on the light-emitting structure, the transmissive material layer contacting a top surface of the light-emitting structure;
   a support structure covering at least a portion of a side surface of the transmissive material layer, a side surface of the light-emitting structure, and at least a portion of a bottom surface of the light-emitting structure, the side surface of the transmissive material layer being parallel to and non-contiguous with the side surface of the light-emitting structure; and an electrode connected to the bottom surface of the light emitting structure, the electrode including a first electrode and a second electrode, the first electrode connected to the first conductivity type layer through an opening in the second conductivity type layer and active layer, the second electrode connected to the second conductivity type layer, wherein the support structure comprises:
- a first material from a bottom surface of the support structure to a first level, and the first material covering the side surface of the light-emitting structure; and
- a second material from the first level to a top surface of the support structure, the second material different from the first material, and the second material covering at least a portion of a side surface of the transmissive material layer;

a light reflection efficiency of the first material is greater than that of the second material.

2. The LED package of claim 1,
wherein the support structure defines the electrode and covers the bottom surface of the light-emitting structure.

3. The LED package of claim 1, wherein
the support structure has a cup shape; and
the support structure includes,
- a bottom unit at a lower level than the bottom surface of the light-emitting structure, and
- a sidewall unit at a higher level than the bottom surface of the light-emitting structure, the sidewall unit covering at least a portion of the side surface of the transmissive material layer and the side surface of the light-emitting structure.

4. The LED package of claim 3, wherein
the sidewall unit is divided into a first sidewall and a second sidewall, the first sidewall contacting a side surface of the transmissive material layer, and the second sidewall contacting a side surface of the light-emitting structure; and
a first thickness of the first sidewall is less than or equal to a second thickness of the second sidewall.

5. The LED package of claim 1, wherein a top surface of the transmissive material layer has one of a convex shape, a flat shape, and a concave shape.

6. The LED package of claim 1, wherein a difference between a width of the support structure and a width of the light-emitting structure is less than half the width of the light-emitting structure.

7. The LED package of claim 1, wherein the support structure is one body including a same material.

8. The LED package of claim 1, wherein the transmissive material layer comprises at least one of a wavelength conversion layer and a lens layer.

9. The LED package of claim 1, wherein the transmissive material layer has a stack structure including a plurality of wavelength conversion layers.

* * * * *